United States Patent
Tsubaki et al.

(10) Patent No.: US 7,338,744 B2
(45) Date of Patent: Mar. 4, 2008

(54) POSITIVE RESIST COMPOSITION AND PATTERN FORMING METHOD USING THE SAME

(75) Inventors: Hideaki Tsubaki, Shizuoka (JP); Shinji Tarutani, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/356,051

(22) Filed: Feb. 17, 2006

(65) Prior Publication Data

US 2006/0194148 A1 Aug. 31, 2006

(30) Foreign Application Priority Data

Feb. 23, 2005 (JP) .................. P. 2005-047392

(51) Int. Cl.
*G03F 7/039* (2006.01)

(52) U.S. Cl. .................... 430/270.1; 430/326

(58) Field of Classification Search ...... None
See application file for complete search history.

(56) References Cited

U.S. PATENT DOCUMENTS

| 5,266,566 A * | 11/1993 | Marples et al. ............ 514/182 |
| 5,693,452 A * | 12/1997 | Aoai et al. ................. 430/270.1 |
| 2003/0219680 A1* | 11/2003 | Nishimura et al. ........ 430/270.1 |
| 2003/0224287 A1* | 12/2003 | Fujimori .................... 430/270.1 |
| 2004/0053161 A1* | 3/2004 | Kanna et al. .............. 430/270.1 |
| 2004/0253538 A1* | 12/2004 | Fujimori .................... 430/270.1 |
| 2005/0214676 A1* | 9/2005 | Toishi et al. ............... 430/270.1 |

FOREIGN PATENT DOCUMENTS

| JP | 11-338150 A | 12/1999 |
| JP | 2000-47385 A | 2/2000 |
| JP | 2000-187327 A | 7/2000 |
| JP | 2001-343750 A | 12/2001 |
| JP | 2002-72481 A | 3/2002 |
| JP | 2003-270791 A | 9/2003 |

OTHER PUBLICATIONS

Babler et al, "Preparation of Samll Ring Carbocycles via Intramolecular Oxidative Coupling of Bisenolates Derived . . . ", J. Org. Chem, 1987, vol. 52 pp. 3462-3464.*
Backer et al (AN 1940:12894, CAPLUS, ACS on STN, English abstract of French Journal article from Rexueil des Travaux Chimiques des Pays-Bas et de la Belgique (1939, vol. 58 pp. 1048-1061) entered into STN on Dec. 16, 2001.*
"Dicarboxylic acid-Wikipedia, the free encyclopedia" from http:..en.wikipedia.org/wiki/Dicarboxylic_acid, two pages printed out Jan. 4, 2007.*

* cited by examiner

*Primary Examiner*—Cynthia Hamilton
(74) *Attorney, Agent, or Firm*—Sughrue Mion, PLLC

(57) ABSTRACT

The invention provides a positive resist composition suitably usable at the time of using an ArF excimer laser light as the exposure light source, assured of excellent performance in view of resist profile, sensitivity, resolution and line edge roughness, and free from occurrence of pattern falling and development defect, and a pattern forming method using the composition, which are a positive resist composition comprising (A) a compound capable of generating an acid upon irradiation with actinic rays or radiation, (B) a resin having an alicyclic hydrocarbon structure, which decomposes under the action of an acid to increase the solubility in an alkali, and (C) a chain compound having one or two group(s) selected from a hydroxyl group and a group where the hydrogen atom of a hydroxyl group is substituted with an organic group, in which the chain compound is a solid at ordinary temperature under atmospheric pressure, and a pattern forming method using the composition.

7 Claims, No Drawings

POSITIVE RESIST COMPOSITION AND PATTERN FORMING METHOD USING THE SAME

BACKGROUND OF THE INVENTION

1. Field of the Invention

The present invention relates to a positive resist composition for use in the apparatus of producing a semiconductor such as IC, in the production of a circuit board for liquid crystal, thermal head and the like, or in other photofabrication processes, and a pattern forming method using the same. More specifically, the present invention relates to a positive resist composition suitable for the fine processing of a semiconductor device, where a light energy ray at a short wavelength such as far ultraviolet ray, X-ray and electron beam is used, and a pattern forming method using the same. In particular, the present invention relates to a positive resist composition suitably used for the fine processing of a semiconductor device, where an ArF excimer laser is used, and a pattern forming method using the same.

2. Background Art

With recent progress to a higher integration of a semiconductor integrated circuit, LSI or VLSI has come to be used in practice and at the same time, the minimum pattern width of the integrated circuit has reached the region of a sub-half micron. Thus, the processing is proceeding to finer processing.

To cope with this trend, requirements for the photolithographic technology used to form a fine pattern have become severer and severer. One known technique for attaining a fine pattern is to shorten the wavelength of exposure light used at the pattern formation of a resist.

For example, in the production of DRAM having an integration degree up to 64 M bits, the i-line (365 nm) of a high-pressure mercury lamp has been used as the light source until today. Also, in the mass production process of a 256 M-bit DRAM, a KrF excimer laser (248 nm) is practically used as the light source in place of the i-line. Furthermore, for the purpose of producing DRAM having an integration degree of 1 G bits or more, studies have been made on use of a light source having a further shorter wavelength, that is, an ArF excimer laser (193 nm), an $F_2$ excimer laser (157 nm), an X-ray or an electron beam.

In particular, an ArF excimer laser is estimated as the exposure technique in the next generation, and development of a high-sensitivity and high-resolution resist for an ArF excimer laser is being demanded.

With respect to the resist used for the pattern formation by a lithography in this wavelength region, a chemical amplification-type resist is known. In the chemical amplification-type resist, a compound capable of generating an acid resulting from photodecomposition is generally combined with a binder resin. This binder resin is a resin having, within the molecule, a group capable of decomposing under the action of an acid to increase the solubility in an alkali developer. In addition to the above-described compound, a low molecular compound having a specific structure is sometimes blended in the chemical amplification-type resist.

In the lithography using a chemical amplification-type resist, a resist excellent in various properties such as sensitivity, resolving power, profile, coatability, heat resistance, dry etching resistance, adhesive property, substrate dependency, stability against environment (for example, dimensional stability of resist against fluctuation in the setting time) and focus depth (for example, pattern forming property with a focus gap at the irradiation of radiation), is demanded and many devices for improving the performance by additives have been hitherto disclosed.

The problem standing in the way of recent movement to refinement and high throughput is the line edge roughness. The line edge roughness means that the edge of the interface between the resist line pattern and the substrate irregularly fluctuates in the direction perpendicular to the line direction due to properties of the resist and when the pattern is observed from right above, the edge gives a rough appearance. This roughness inhibits the resolution of the pattern or is transferred by the etching step using the resist as a mask to cause deterioration of the electric characteristics and in turn reduction in the yield. Furthermore, the recent refinement requires a strict aspect ratio for the film thickness and therefore, the pattern falls down very easily. This tendency is particularly prominent in the resist for ArF. The pattern falling as used herein includes all fallings such as falling due to insufficient adhesion and falling due to insufficient film strength. In addition, the problem of development defect is serious. With respect to the resist composition for an ArF light source, a resin having introduced thereinto an alicyclic hydrocarbon moiety for imparting dry etching resistance has been proposed, but the introduction of an alicyclic hydrocarbon moiety raises a problem that the system becomes significantly hydrophobic. As a result, development with a tetramethylammonium hydroxide (hereinafter referred to as "TMAH") which has been heretofore widely used as the developer for resist, becomes difficult or a phenomenon such as separation of the resist from the substrate during development is observed. The approach generally taken to solve the problem of pattern falling or development defect is to introduce a hydrophilic group and thereby compensate for the effect of the hydrophobic part of the resin, specifically, the alicyclic hydrocarbon moiety. However, this causes deterioration of dry etching resistance in many cases and moreover, the resist undergoes significant film loss, giving rise to a problem such as increase of light edge roughness.

For the purpose of improving the line edge roughness, pattern falling and development defect, attempts are being made to add various compounds, particularly, a non-aromatic organic low molecular compound having a hydroxyl group or a carboxyl group, to the chemical amplification resist composition. For example, for the purpose of preventing the pattern falling and improving the line edge roughness, Patent Document 1 (JP-A-2003-270791 (the term "JP-A" as used herein means an "unexamined published Japanese patent application")) discloses a positive resist composition comprising a chain low molecular compound having at least three hydroxyl groups or substituted hydroxyl groups. Also, Patent Document 2 (JP-A-2001-343750) discloses that specific cyclohexanols are effective for the improvement of line edge roughness. As for the reduction in the development defect, Patent Document 3 (JP-A-2000-187327), Patent Document 4 (JP-A-11-338150), Patent Document 5 (JP-A-2000-47385) and Patent Document 6 (JP-A-2002-72481) disclose that addition of a low molecular compound containing a hydrophilic functional group and a cyclic hydrocarbon group is effective.

When the conventional organic low molecular compounds are used, this is surely effective for individual problems of line edge roughness, pattern falling and development defect, but it has been impossible to solve all of these problems at the same time either by using one of those organic low molecular compounds alone or by using a plurality thereof.

SUMMARY OF THE INVENTION

An object of the present invention is to provide a positive resist composition ensuring excellent line edge roughness performance and no occurrence of pattern falling and development defect when deep ultraviolet light, particularly, ArF excimer laser light, is used as the exposure light source, and a pattern forming method using the composition.

As a result of intensive studies on the constituent materials of the resist composition in the positive chemical amplification system, the present inventors have found that when (A) a compound capable of generating an acid upon irradiation with actinic rays or radiation, (B) a resin having an alicyclic hydrocarbon structure, which decomposes under the action of an acid to increase the solubility in an alkali, and (C) a chain compound having one or two group(s) selected from a hydroxyl group and a group where the hydrogen atom of a hydroxyl group is substituted with an organic group, and being a solid at ordinary temperature under atmospheric pressure, are combined, a positive resist composition ensuring excellent line edge roughness performance and no occurrence of pattern falling and development defect can be obtained. The present invention has been accomplished based on this finding.

That is, the present invention provides a positive resist composition having the following constitutions and a pattern forming method using the composition, and the above-described object of the present invention can be achieved by these composition and method.

1. A positive resist composition comprising:

(A) a compound capable of generating an acid upon irradiation with actinic rays or radiation;

(B) a resin having an alicyclic hydrocarbon structure, which decomposes under the action of an acid to increase the solubility in an alkali; and (C) a chain compound having one or two group(s) selected from a hydroxyl group and a group where the hydrogen atom of a hydroxyl group is substituted with an organic group, the chain compound being a solid at ordinary temperature under atmospheric pressure.

2. The positive resist composition as described in the item 1, wherein the compound (C) is represented by the following formula (I):

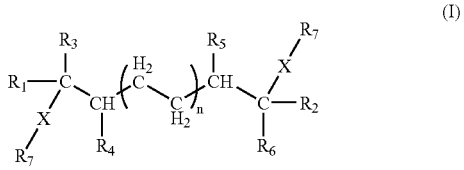

wherein $R_1$ and $R_2$ each independently represents a methyl group, a hydroxyl group, or a group where the hydrogen atom of a hydroxyl group is substituted with an organic group, $R_3$ to $R_6$ each independently represents a hydrogen atom, a methyl group, a hydroxyl group, or a group where the hydrogen atom of a hydroxyl group is substituted with an organic group, provided that the total of the number of hydroxyl group and the number of the group where the hydrogen atom of a hydroxyl group is substituted with an organic group in $R_1$ to $R_6$ is 1 or 2, X represents a single bond or a double bond, $R_7$ represents a hydrogen atom or an oxygen atom, provided that when X is a single bond, $R_7$ represents a hydrogen atom and when X is a double bond, $R_7$ represents an oxygen atom, and n is an integer of 2 to 10.

3. The positive resist composition as described in the item 1 or 2, wherein the compound (C) has a melting point of 30° C. or more at 760 mmHg and 25° C.

4. The positive resist composition as described in any one of the items 1 to 3, which further comprises (D) a basic compound.

5. The positive resist composition as described in any one of the items 1 to 4, which further comprises (E) a fluorine- and/or silicon-containing surfactant.

6. The positive resist composition as described in any one of the items 1 to 5, which further comprises (F) an organic solvent.

7. A pattern forming method comprising: forming a resist film from the positive resist composition described in any one of the items 1 to 6; and exposing and developing said resist film.

According to the present invention, a positive resist composition ensuring excellent line edge roughness performance and no occurrence of pattern falling and development defect, and a pattern forming method using the composition can be provided.

DETAILED DESCRIPTION OF THE INVENTION

The present invention is described in detail below.

In the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

[1] (A) Compound Capable of Generating an Acid Upon Irradiation with Actinic Rays or Radiation The positive resist composition of the present invention comprises a compound capable of generating an acid upon irradiation with actinic rays or radiation (hereinafter sometimes referred to as a "photoacid generator" or a "compound as the component (A)"). As for this photoacid generator, a photoinitiator for photocationic polymerization, a photoinitiator for photoradical polymerization, a photo-decoloring agent for dyes, a known compound capable of generating an acid upon irradiation with actinic rays or radiation, which is used for microresist and the like, or a mixture thereof may be appropriately selected and used.

Examples thereof include a diazonium salt, a phosphonium salt, a sulfonium salt, an iodonium salt, an imidosulfonate, an oxime sulfonate, a diazodisulfone, a disulfone and an o-nitrobenzyl sulfonate.

Also, a compound where the above-described group or compound capable of generating an acid upon irradiation with actinic rays or radiation is introduced into the polymer main or side chain, such as compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, a compound capable of generating an acid by the effect of light described, for example, in U.S. Pat. No. 3,779,778 and European Patent 126,712 may also be used.

Examples of the compound capable of generating an acid upon irradiation with actinic rays or radiation, which can be used, include the compounds represented by the following formulae (ZI), (ZII) and (ZIII):

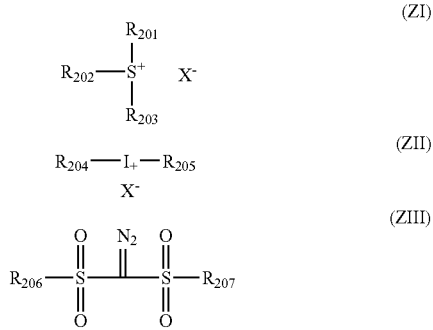

In formula (ZI), $R_{201}$, $R_{202}$ and $R_{203}$ each independently represents an organic group.

$X^-$ represents a non-nucleophilic anion, and preferred examples thereof include sulfonate anion, carboxylate anion, bis(alkylsulfonyl)imide anion, tris(alkylsulfonyl)methide anion, $BF_4^-$, $PF_6^-$ and $SbF_6^-$. An organic anion having a carbon atom is preferred. Preferred examples of the organic anion include organic anions represented by the following formulae.

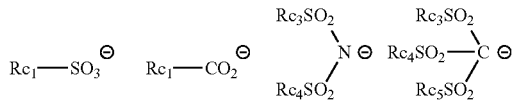

In the formulae above, $Rc_1$ represents an organic group. The organic group in $Rc_1$ includes an organic group having a carbon number of 1 to 30, and preferred examples thereof include an alkyl or aryl group which may be substituted, and a group where a plurality of these alkyl or aryl groups are connected through a linking group such as single bond, —O—, —$CO_2$—, —S—, —$SO_3$— and —$SO_2N(Rd_1)$-. $Rd_1$ represents a hydrogen atom or an alkyl group. $Rc_3$, $Rc_4$ and $Rc_5$ each independently represents an organic group. The organic group of $Rc_3$, $Rc_4$ and $Rc_5$ is preferably an organic group the same as the preferred organic group in $Rb_1$, more preferably a perfluoroalkyl group having a carbon number of 1 to 4. $Rc_3$ and $Rc_4$ may combine to form a ring. The group formed by combining $Rc_3$ and $Rc_4$ includes an alkylene group and an arylene group and is preferably a perfluoroalkylene group having a carbon number of 2 to 4. The organic group of $Rc_1$ and $Rc_3$ to $Rc_5$ is most preferably an alkyl group with the 1-position being substituted by a fluorine atom or a fluoroalkyl group, or a phenyl group substituted by a fluorine atom or a fluoroalkyl group. By virtue of having a fluorine atom or a fluoroalkyl group, the acidity of the acid generated upon light irradiation is increased and the sensitivity is enhanced.

The carbon number of the organic group as $R_{201}$, $R_{202}$ and $R_{203}$ in formula (ZI) is generally from 1 to 30, preferably from 1 to 20. Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene). Specific examples of the organic group as $R_{201}$, $R_{202}$ and $R_{203}$ include corresponding groups in the compounds (ZI-1), (ZI-2) and (ZI-3) which are described later.

The compound may be a compound having a plurality of structures represented by formula (ZI). For example, the compound may be a compound having a structure that at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (Z1) is an aryl group, that is, a compound having an arylsulfonium as the cation. In the arylsulfonium compound, $R_{201}$ to $R_{203}$ all may be an aryl group or a part of $R_{201}$ to $R_{203}$ may be an aryl group with the remaining being an alkyl group or a cycloalkyl group. Examples of the arylsulfonium compound include a triarylsulfonium compound, a diarylalkylsulfonium compound, a diarylcycloalkylsulfonium compound, an aryldialkylsulfonium compound and an aryldicycloalkylsulfonium compound.

The aryl group in the arylsulfonium compound is preferably an aryl group such as phenyl group and naphthyl group, or a heteroaryl group such as indole residue and pyrrole residue, more preferably a phenyl group or an indole residue. In the case where the arylsulfonium compound has two or more aryl groups, these two or more aryl groups may be the same of different.

The alkyl group which is present, if desired, in the arylsulfonium compound is preferably a linear or branched alkyl group having a carbon number of 1 to 15 such as methyl group, ethyl group, propyl group, n-butyl group, sec-butyl group and tert-butyl group.

The cycloalkyl group which is present, if desired, in the arylsulfonium compound is preferably a cycloalkyl group having a carbon number of 3 to 15 such as cyclopropyl group, cyclobutyl group and cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, and most preferably an alkyl group having a carbon number of 1 to 4 or an alkoxy group having a carbon number of 1 to 4. The substituent may be substituted to any one of three members $R_{201}$ to $R_{203}$ or may be substituted to all of these three members. In the case where $R_{201}$ to $R_{203}$ each is an aryl group, the substituent is preferably substituted at the p-position of the aryl group.

The compound (ZI-2) is described below. The compound (ZI-2) is a compound where $R_{201}$ to $R_{203}$ in formula (ZI) each independently represents an aromatic ring-free organic group. The aromatic ring as used herein includes an aromatic ring containing a heteroatom. The aromatic ring-free organic group as $R_{201}$ to $R_{203}$ generally has a carbon number of 1 to 30, preferably from 1 to 20.

$R_{201}$ to $R_{203}$ each is preferably an alkyl group, a cycloalkyl group, an allyl group or a vinyl group, more preferably a linear, branched or cyclic 2-oxoalkyl group or an alkoxycarbonylmethyl group, still more preferably a linear or branched 2-oxoalkyl group.

The alkyl group as $R_{201}$ to $R_{203}$ may be linear or branched and is preferably a linear or branched alkyl group having a carbon number of 1 to 10, and examples thereof include a methyl group, an ethyl group, a propyl group, a butyl group and a pentyl group. The alkyl group as $R_{201}$ to $R_{203}$ is more preferably a linear or branched 2-oxoalkyl group or an alkoxycarbonylmethyl group.

The cycloalkyl group as $R_{201}$ to $R_{203}$ is preferably a cycloalkyl group having a carbon number of 3 to 10, and examples thereof include a cyclopentyl group, a cyclohexyl group and a norbornyl group. The cycloalkyl group as $R_{201}$ to $R_{203}$ is more preferably a cyclic 2-oxoalkyl group.

The linear, branched or cyclic 2-oxoalkyl group as $R_{201}$ to $R_{203}$ is preferably a group having >C=O at the 2-position of the above-described alkyl or cycloalkyl group.

The alkoxy group in the alkoxycarbonylmethyl group as $R_{201}$ to $R_{203}$ is preferably an alkoxy group having a carbon number of 1 to 5 (e.g., methoxy, ethoxy, propoxy, butoxy, pentyloxy).

$R_{201}$ to $R_{203}$ each may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

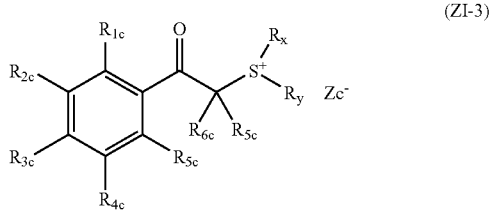

(ZI-3)

In formula (ZI-3), $R_{1c}$ to $R_{5c}$ each independently represents a hydrogen atom, an alkyl group, a cycloalkyl group, an alkoxy group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

Any two or more members out of $R_{1c}$ to $R_{5c}$ or each pair of $R_{6c}$ and $R_{7c}$, and $R_x$ and $R_y$ may combine with each other to form a ring structure, and the ring structure may contain an oxygen atom, a sulfur atom, an ester bond or an amide bond. Examples of the group formed by combining any two or more members out of $R_{1c}$ to $R_{5c}$ or combining each pair of $R_{6c}$ and $R_{7c}$, and $R_x$ and $R_y$ include a butylene group and a pentylene group.

$Zc^-$ represents a non-nucleophilic anion, and examples thereof are the same as those of the non-nucleophilic anion of $X^-$ in formula (ZI).

The alkyl group as $R_{1c}$ to $R_{7c}$ may be linear or branched and is preferably a linear or branched alkyl group having a carbon number of 1 to 20, more preferably from 1 to 12, and examples thereof include a methyl group, an ethyl group, a linear or branched propyl group, a linear or branched butyl group, a linear or branched pentyl group.

The cycloalkyl group as $R_{1c}$ to $R_{7c}$ is preferably a cycloalkyl group having a carbon number of 3 to 8, and examples thereof include a cyclopentyl group and a cyclohexyl group.

The alkoxy group as $R_{1c}$ to $R_{5c}$ may be linear, branched or cyclic and this is, for example, an alkoxy group having a carbon number of 1 to 10, preferably a linear or branched alkoxy group having a carbon number of 1 to 5 (e.g., methoxy, ethoxy, linear or branched propoxy, linear or branched butoxy, linear or branched pentoxy) or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. In this case, the solubility in a solvent is more enhanced and the generation of particles during storage is suppressed.

Examples of the alkyl group and cycloalkyl group as $R_x$ and $R_y$ are the same as those of alkyl group and cycloalkyl group in $R_{1c}$ to $R_{7c}$. The alkyl group as $R_x$ and $R_y$ is preferably a linear or branched 2-oxoalkyl group or an alkoxymethyl group. The cycloalkyl group as $R_x$ and $R_y$ is preferably a cyclic a 2-oxoalkyl group.

Examples of the linear, branched or cyclic 2-oxoalkyl group include a group having >C=O at the 2-position of the alkyl group or cycloalkyl group as $R_{1c}$ to $R_{7c}$.

Examples of the alkoxy group in the alkoxycarbonylmethyl group are the same as those of the alkoxy group in $R_{1c}$ to $R_{5c}$.

$R_x$ and $R_y$ each is preferably an alkyl or cycloalkyl group having a carbon number of 4 or more, more preferably 6 or more, still more preferably 8 or more.

In formulae (ZII) and (ZIII), $R_{204}$ to $R_{207}$ each independently represents an aryl group which may have a substituent, an alkyl group which may have a substituent, or a cycloalkyl group which may have a substituent.

The aryl group as $R_{204}$ to $R_{207}$ is preferably a phenyl group or a naphthyl group, more preferably a phenyl group.

The alkyl group as $R_{204}$ to $R_{207}$ may be linear or branched and is preferably a linear or branched alkyl group having a carbon number of 1 to 10, and examples thereof include a methyl group, an ethyl group, a propyl group, a butyl group and a pentyl group.

The cycloalkyl group as $R_{204}$ to $R_{207}$ is preferably a cycloalkyl group having a carbon number of 3 to 10, and examples thereof include a cyclopentyl group, a cyclohexyl group and a norbornyl group.

Examples of the substituent which $R_{204}$ to $R_{207}$ each may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$X^-$ represents a non-nucleophilic anion and examples thereof are the same as those of the non-nucleophilic anion of $X^-$ in formula (I).

Other examples of the compound capable of generating an acid upon irradiation with actinic rays or radiation, which can be used, include the compounds represented by the following formulae (ZIV), (ZV) and (ZVI):

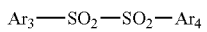 (ZIV)

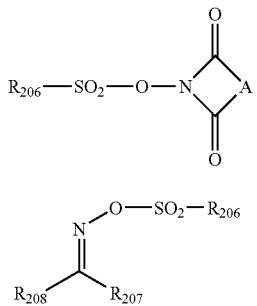
(ZV)

(ZVI)

In formulae (ZIV) to (ZVI),

Ar₃ and Ar₄ each independently represents a substituted or unsubstituted aryl group, $R_{206}$, $R_{207}$ and $R_{208}$ each independently represents a substituted or unsubstituted alkyl group, a substituted or unsubstituted cycloalkyl group, or a substituted or unsubstituted aryl group, and A represents a substituted or unsubstituted alkylene group, a substituted or unsubstituted alkenylene group, or a substituted or unsubstituted arylene group.

Among the compounds capable of generating an acid upon irradiation with actinic rays or radiation, preferred are the compounds represented by formulae (ZI) to (ZIII).

The content of the compound (A) in the positive resist composition of the present invention is preferably from 0.1 to 20 mass %, more preferably from 0.5 to 15 mass %, still more preferably from 1 to 10 mass %, based on the solid content of the composition.

Out of the compounds capable of decomposing upon irradiation with actinic rays or radiation to generate an acid, particularly preferred examples are forth below.

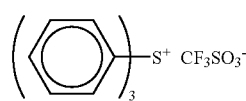 (z1)

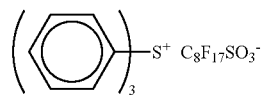 (z3)

(z2)

(z4)

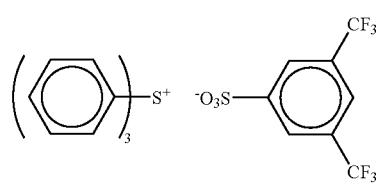

(z5)

(z6)

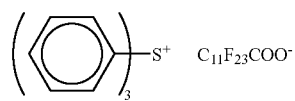 (z7)

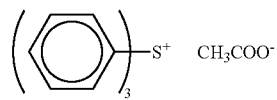 (z9)

(z8)

(z10)

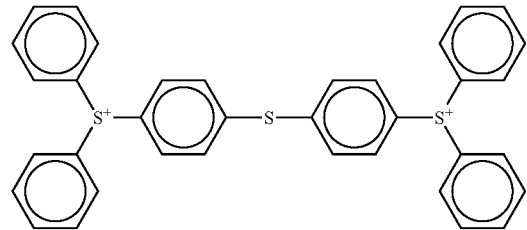

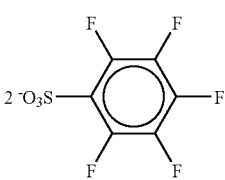

-continued
(z11)
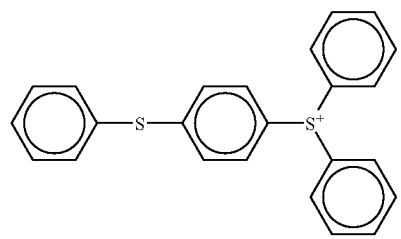 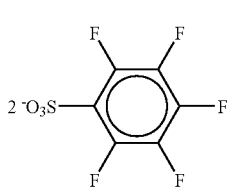
(z12)
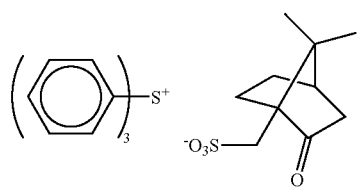
(z13)
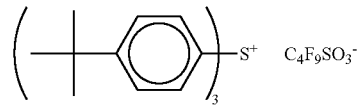
(z14)
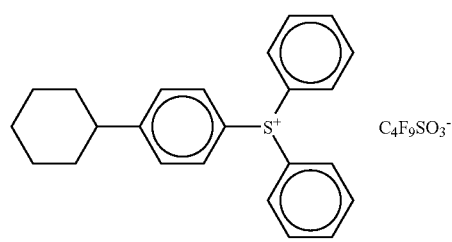
(z15)
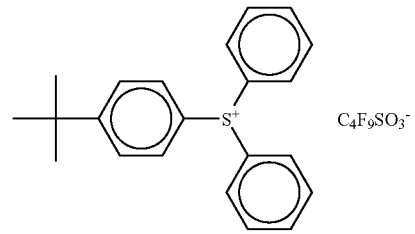
(z16)
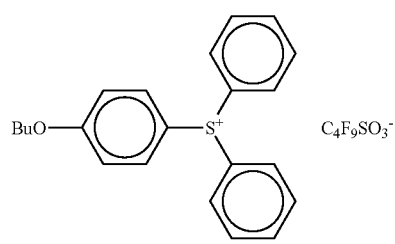
(z17)
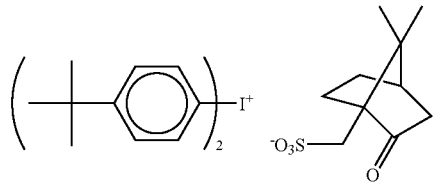
(z18)
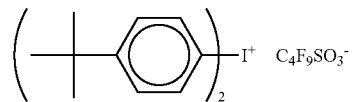
(z19)
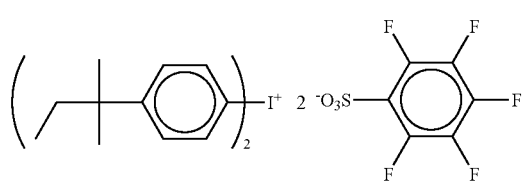
(z20)
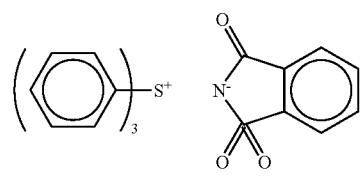
(z21)
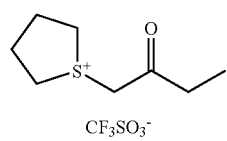
(z22)
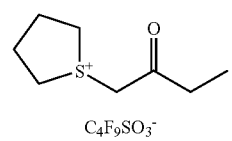
(z23)
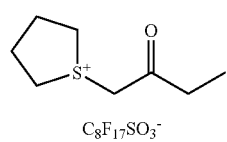
(z24)
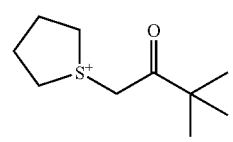

-continued
(z25) 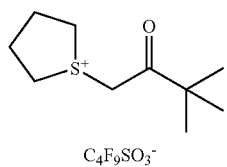
C₄F₉SO₃⁻
(z26) 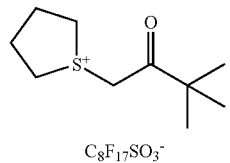
C₈F₁₇SO₃⁻
(z27) 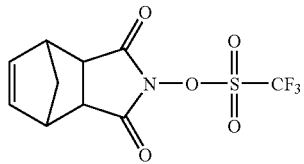
(z28) 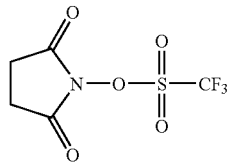
(z29) 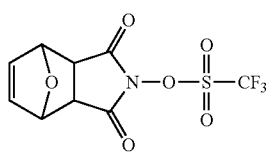
(z30) 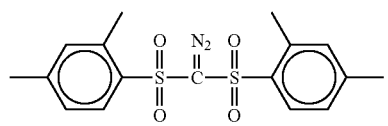
(z31) 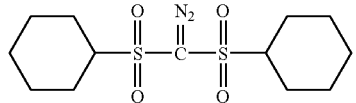
(z32) 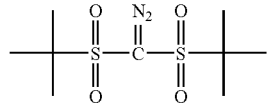
(z33) 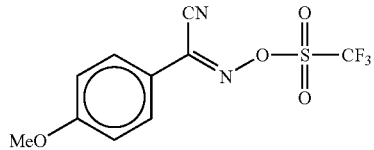
(z34) 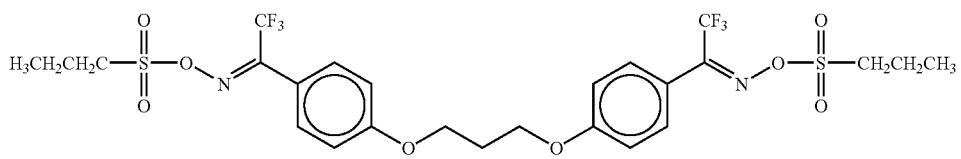
(z35) 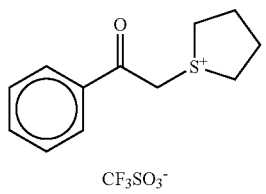
CF₃SO₃⁻
(z36) 
C₄F₉SO₃⁻
(z37) 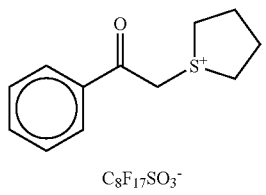
C₈F₁₇SO₃⁻
(z38) 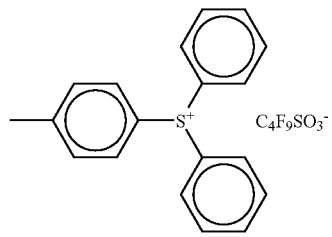
C₄F₉SO₃⁻

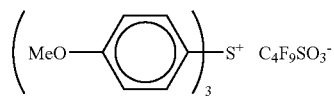
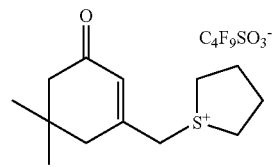
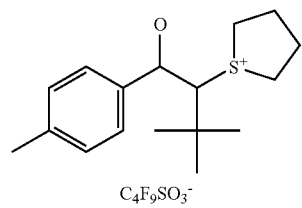
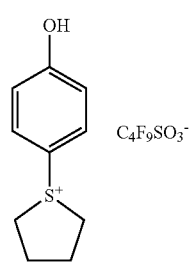
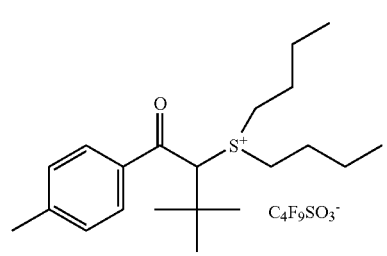
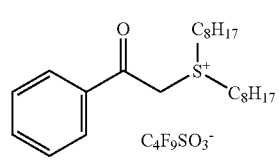
-continued
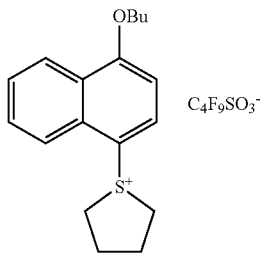
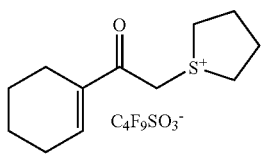
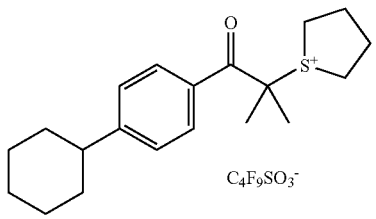
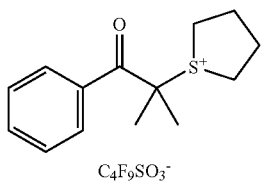
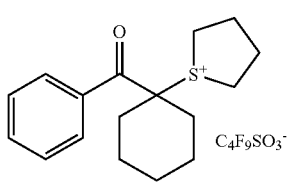
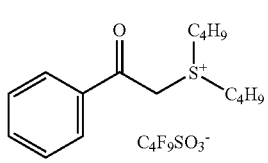
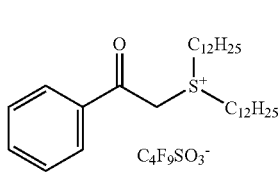

-continued
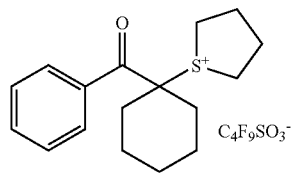 (z53)
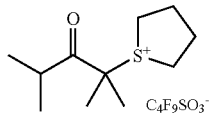 (z54)
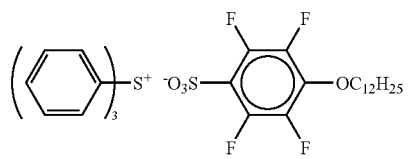 (z55)
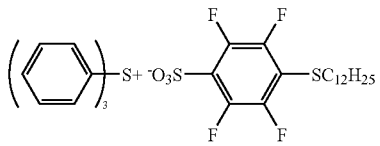 (z56)
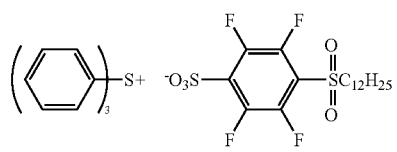 (z57)
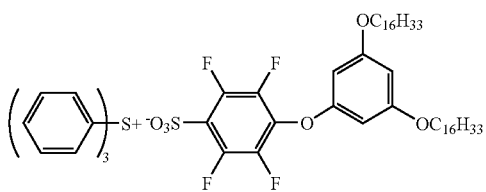 (z58)
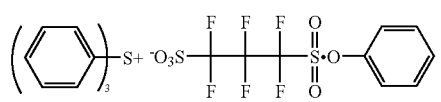 (z59)
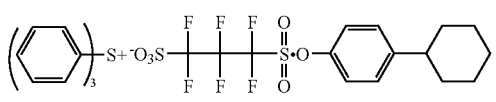 (z60)
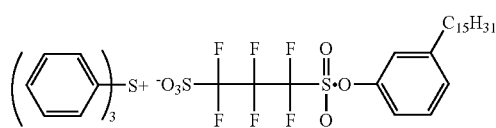 (z61)
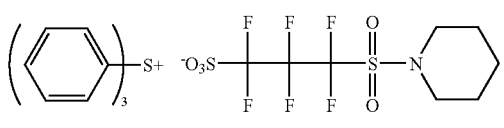 (z62)
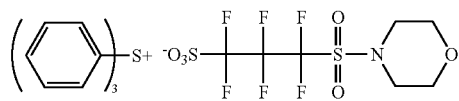 (z63)
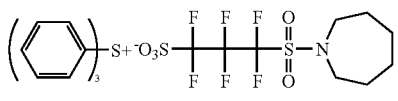 (z64)
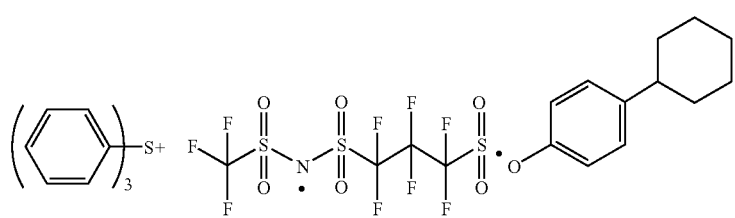 (z65)
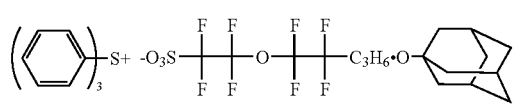 (z66)
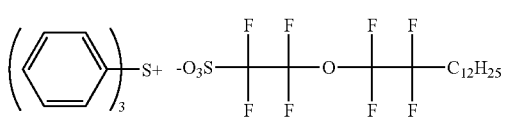 (z67)
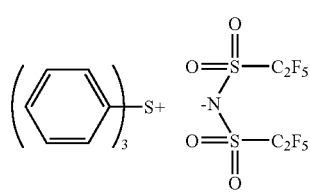 (z68)
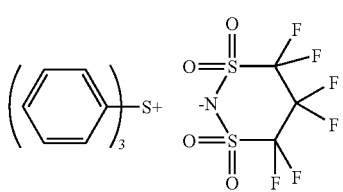 (z69)

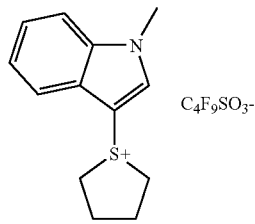
(z70)

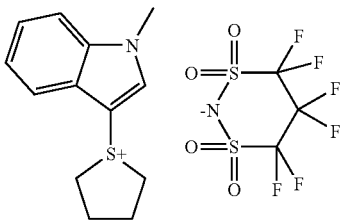
(z71)

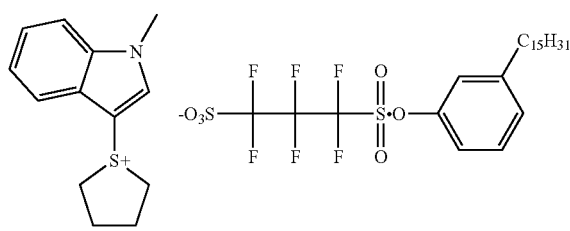
(z72)

[2] (B) Resin Having an Alicyclic Hydrocarbon Structure, which Decomposes Under the Action of an Acid to Increase the Solubility in an Alkali Developer The positive resist composition of the present invention comprises a resin having an alicyclic hydrocarbon structure, which decomposes under the action of an acid to increase the solubility in an alkali developer (hereinafter sometime referred to as an "acid-decomposable resin").

The acid-decomposable resin for use in the present invention has a group capable of decomposing under the action of an acid to increase the solubility in an alkali (hereinafter sometimes referred to as an "acid-decomposable group").

Examples of the acid decomposable group include a group after the hydrogen atom of an alkali-soluble group such as carboxylic acid group, sulfonic acid group, phenol group or thiol group, is protected by a group which desorbs under the action of an acid.

Examples of the group which desorbs under the action of an acid include —C($R_{36}$)($R_{37}$)($R_{38}$) and —C($R_{01}$)($R_{02}$)(O$R_{39}$). In the formulae, $R_{36}$ to $R_{39}$ each independently represents an alkyl group, a cycloalkyl group, an aryl group, an aralkyl group or an alkenyl group, and $R_{36}$ and $R_{37}$ may combine with each other to form a ring. $R_{01}$ and $R_{02}$ each independently represents a hydrogen atom, an alkyl group, a cycloalkyl group, an aryl group, an aralkyl group or an alkenyl group.

The acid-decomposable group for use in the present invention is preferably a resin having at least one repeating unit selected from the group consisting of a repeating unit having a partial structure containing an alicyclic hydrocarbon represented by any one of the following formulae (pI) to (pVI) and a repeating unit represented by the following formula (II-AB), more preferably a resin having a repeating unit having a partial structure containing an alicyclic hydrocarbon represented by any one of the following formulae (pI) to (pVI).

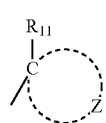
(pI)

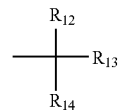
(pII)

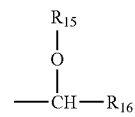
(pIII)

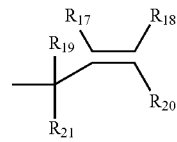
(pIV)

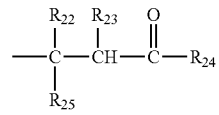
(pV)

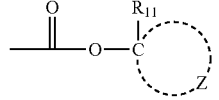
(pVI)

In formulae (pI) to (pVI), $R_{11}$ represents a methyl group, an ethyl group, an n-propyl group, an isopropyl group, an n-butyl group, an isobutyl group or a sec-butyl group, Z represents an atomic group necessary for forming a cycloalkyl group together with the carbon atom, $R_{12}$ to $R_{16}$ each independently represents a linear or branched alkyl group having a carbon number of 1 to 4 or a cycloalkyl group, provided that at least one of $R_{12}$ to $R_{14}$ or either one of $R_{15}$ and $R_{16}$ represents a cycloalkyl group, $R_{17}$ to $R_{21}$ each independently represents a hydrogen atom, a linear or branched alkyl group having a carbon number of 1 to 4 or a cycloalkyl group, provided that at least one of $R_{17}$ to $R_{21}$ represents a cycloalkyl group and that either one of R$_{19}$ and R$_{21}$ represents a linear or branched alkyl group having a carbon number of 1 to 4 or a cycloalkyl group, R$_{22}$ to R$_{25}$ each independently represents a hydrogen atom, a linear or branched alkyl group having a carbon number of 1 to 4, or a cycloalkyl group, provided that at least one of R$_{22}$ to R$_{25}$ represents a cycloalkyl group, and R$_{23}$ and R$_{24}$ may combine with each other to form a ring.

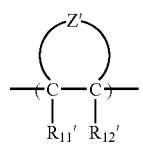

(II-AB)

In formula (II-AB),

R$_{11}$' and R$_{12}$' each independently represents a hydrogen atom, a cyano group, a halogen atom or an alkyl group, and Z' represents an atomic group for forming an alicyclic structure, containing two bonded carbon atoms (C—C).

Formula (II-AB) is preferably the following formula (II-AB1) or (II-AB2).

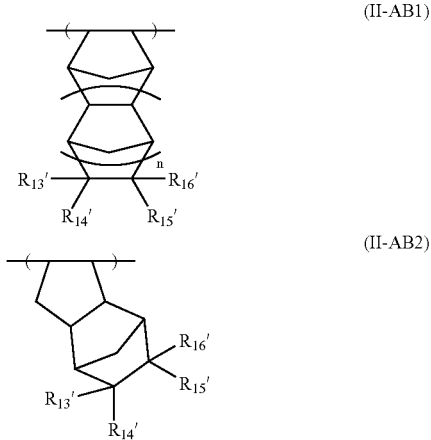

In formulae (II-AB1) and (II-AB2),

R$_{13}$' to R$_{16}$' each independently represents a hydrogen atom, a halogen atom, a cyano group, —COOH, —COOR$_5$, a group capable of decomposing under the action of an acid, —C(=O)—X-A'-R$_{17}$', an alkyl group or a cycloalkyl group, and at least two members out of R$_{13}$' to R$_{16}$' may combine to form a ring, R$_5$ represents an alkyl group, a cycloalkyl group or a group having a lactone structure, X represents an oxygen atom, a sulfur atom, —NH—, —NHSO$_2$— or —NHSO$_2$NH—, A' represents a sing bond or a divalent linking group, R$_{17}$' represents —COOH, —COOR$_5$, —CN, a hydroxyl group, an alkoxy group, —CO—NH—R$_6$, —CO—NH—SO$_2$—R$_6$ or a group having a lactone structure, R$_6$ represents an alkyl group or a cycloalkyl group, and n represents 0 or 1.

In formulae (pI) to (pVI), the alkyl group in R$_{12}$ to R$_{25}$ is a linear or branched alkyl group having from 1 to 4 carbon atoms.

The cycloalkyl group of R$_{11}$ to R$_{25}$ and the cycloalkyl group formed by Z together with the carbon atom may be monocyclic or polycyclic. Specific examples thereof include a group having a monocyclo, bicyclo, tricyclo or tetracyclo structure with a carbon number of 5 or more. The carbon number thereof is preferably from 6 to 30, more preferably from 7 to 25. These cycloalkyl groups each may have a substituent.

Preferred examples of the cycloalkyl group include an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. Among these, more preferred are an adamantyl group, a norbornyl group, a cyclohexyl group, a cyclopentyl group, a tetracyclododecanyl group and a tricyclodecanyl group.

Examples of the substituent which these alkyl group and cycloalkyl group may further have include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). Examples of the substituent which these alkyl group, alkoxy group, alkoxycarbonyl group and the like may further have include a hydroxyl group, a halogen atom and an alkoxy group.

The structures represented by formulae (pI) to (pVI) each can be used for the protection of an alkali-soluble group in the resin. Examples of the alkali-soluble group include various groups known in this technical field.

Specific examples thereof include a structure where the hydrogen atom of a carboxylic acid group, a sulfonic acid group, a phenol group or a thiol group is replaced by the structure represented by any one of formulae (pI) to (pVI). A structure where the hydrogen atom of a carboxylic acid group or a sulfonic acid group is replaced by the structure represented by any one of formulae (pI) to (pV) is preferred.

The structure where the hydrogen atom of an alkali-soluble group is replaced by the structure represented by any one of formulae (pI) to (pVI) decomposes under the action of an acid to form an alkali soluble group, thereby constituting an acid-decomposable group.

The repeating unit having an alkali-soluble group protected by the structure represented by any one of formulae (pI) to (pVI) is preferably a repeating unit represented by the following formula (pA):

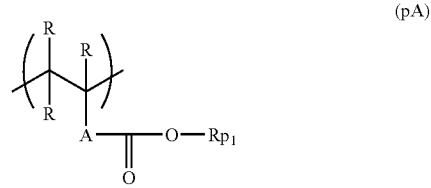

(pA)

In formula (pA), R represents a hydrogen atom, a halogen atom or a linear or branched alkyl group having a carbon number of 1 to 4, and a plurality of R's may be the same or different.

A represents a single bond, or one group or a combination of two or more groups, selected from the group consisting of an alkylene group, an ether group, a thioether group, a carbonyl group, an ester group, an amido group, a sulfonamido group, a urethane group and a urea group. A is preferably a single bond.

Rp$_1$ represents any one group of formulae (pI) to (pV).

The repeating unit represented by formula (pA) is most preferably a repeating unit comprising a 2-alkyl-2-adamantyl (meth)acrylate or a dialkyl(1-adamantyl)methyl (meth)acrylate.
Specific examples of the repeating unit represented by formula (pA) are set forth below.
(In formulae, Rx is H, CH$_3$, CF$_3$, CH$_2$OH or Rxa, and Rxa each is an alkyl group having a carbon number of 1 to 4.)
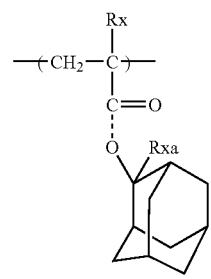
1
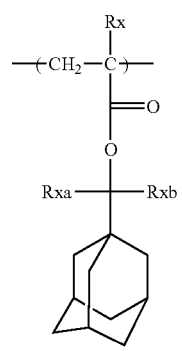
2
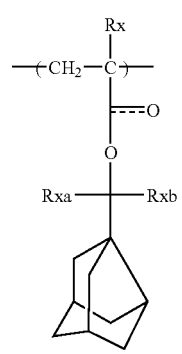
3
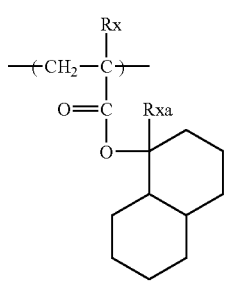
4
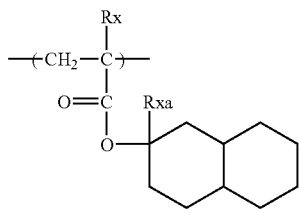
5
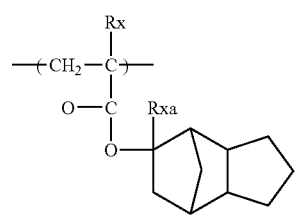
6
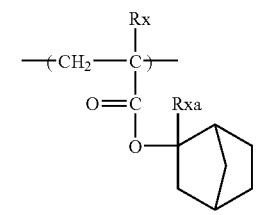
7
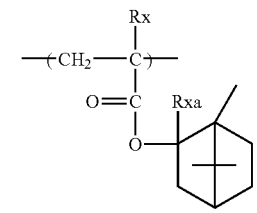
8
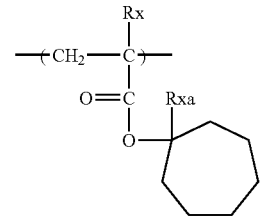
9
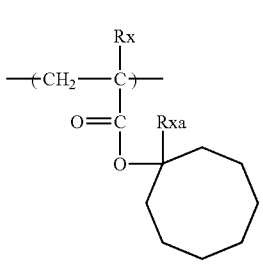
10
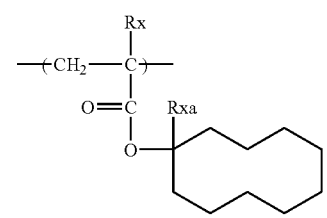
11

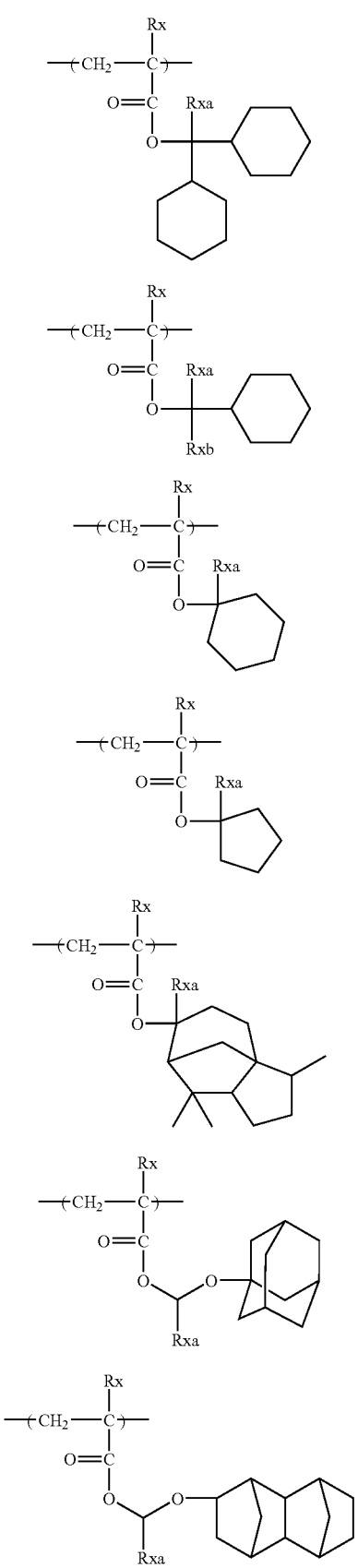

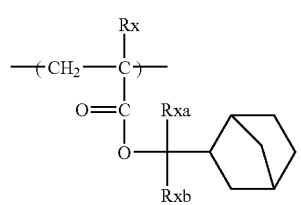

Examples of the halogen atom of $R_{11}'$ and $R_{12}'$ in formula (II-AB) include a chlorine atom, a bromine atom, a fluorine atom and an iodine atom.

The alkyl group of $R_{11}'$ and $R_{12}'$ includes a linear or branched alkyl group having a carbon number of 1 to 10.

The atomic group of Z' for forming an alicyclic structure is an atomic group for forming, in the resin, an alicyclic hydrocarbon repeating unit which may have a substituent, and among these atomic groups, an atomic group for forming a crosslinked alicyclic structure to form a crosslinked alicyclic hydrocarbon repeating unit is preferred.

Examples of the skeleton of the alicyclic hydrocarbon formed are the same as those of the cycloalkyl group of $R_{11}$ to $R_{25}$ in formulae (pI) to (pVI).

The alicyclic hydrocarbon skeleton may have a substituent, and examples of the substituent include $R_{13}'$ to $R_{16}'$ in formulae (II-AB1) and (II-AB2).

In the acid-decomposable resin for use in the present invention, the acid-decomposable group may be contained in at least one repeating unit out of the repeating unit having a partial structure containing an alicyclic hydrocarbon represented by any one of formulae (pI) to (pV), the repeating unit represented by formula (II-AB), and the repeating unit of a copolymerization component which is described later.

Various substituents $R_{13}'$ to $R_{16}'$ in formulae (II-AB1) and (II-AB2) may work out to the substituents of an atomic group for forming an alicyclic structure in formula (II-AB) or an atomic group Z for forming a crosslinked alicyclic structure.

Specific examples of the repeating units represented by formulae (II-AB1) and (II-AB2) are set forth below, but the present invention is not limited thereto.

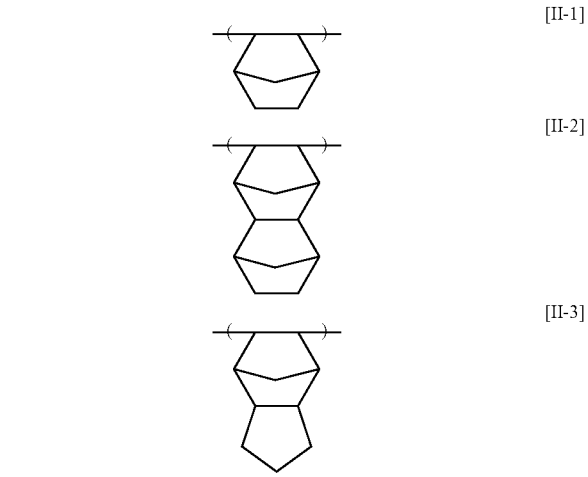

-continued

-continued

[II-21] 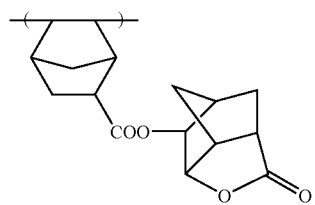

[II-22] 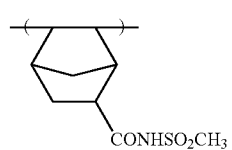

[II-23] 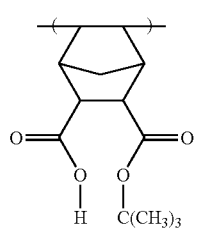

[II-24] 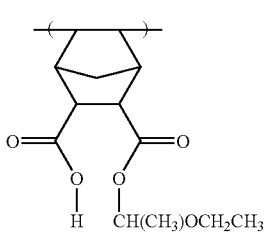

[II-25] 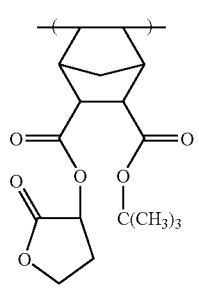

[II-26] 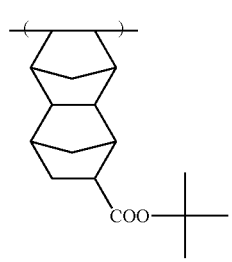

[II-27] 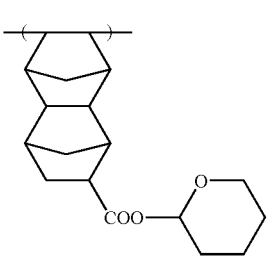

-continued

[II-28] 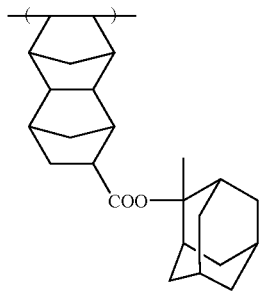

[II-29] 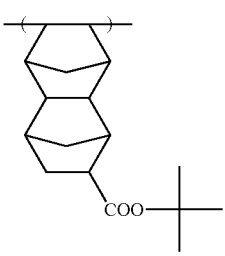

[II-30] 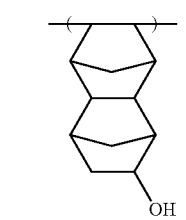

[II-31] 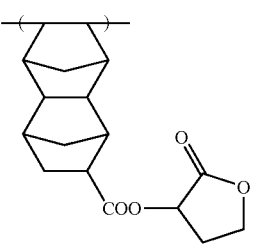

[II-32] 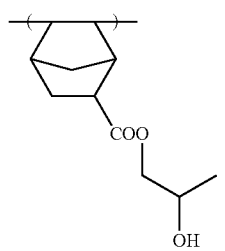

The acid-decomposable resin for use in the present invention preferably has a lactone group. As for the lactone group, any group may be used as long as it has a lactone structure, but a group having a 5-, 6- or 7-membered ring lactone structure is preferred. The 5-, 6- or 7-membered ring structure is preferably condensed with another ring structure in the form of forming a bicyclo structure or a spiro structure. The acid-decomposable resin for use in the present invention more preferably has a repeating unit containing a group having a lactone structure represented by any one of the following formulae (LC1-1) to (LC1-16). The group having a lactone structure may be bonded directly to the main chain. Among these lactone structures, (LC1-1), (LC1-4), (LC1-5), (LC1-6), (LC1-13) and (LC1-14) are preferred. By virtue of using a specific lactone structure, the line edge roughness and the development defect are improved.
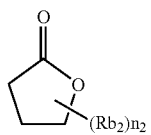
LCl-1
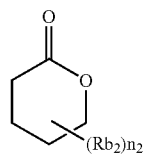
LCl-2
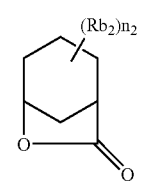
LCl-3
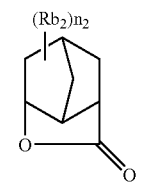
LCl-4
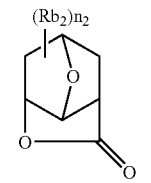
LCl-5
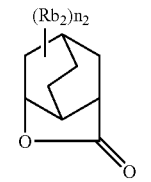
LCl-6
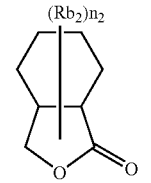
LCl-7
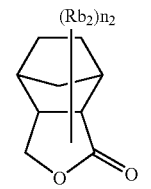
LCl-8
-continued
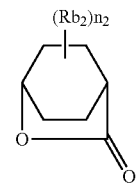
LCl-9
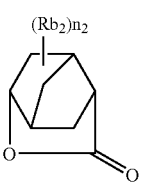
LCl-10
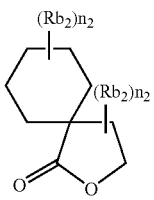
LCl-11
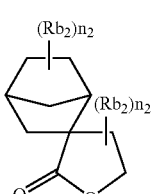
LCl-12
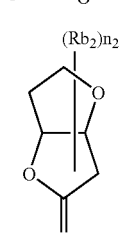
LCl-13
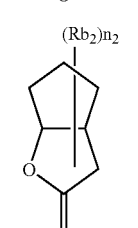
LCl-14
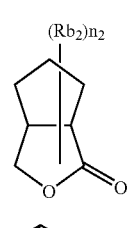
LCl-15
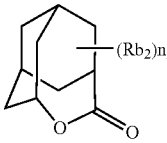
LCl-16

The lactone structure moiety may or may not have a substituent (Rb2). Preferred examples of the substituent (Rb2) include an alkyl group having a carbon number of 1 to 8, a cycloalkyl group having a carbon number of 4 to 7, an alkoxy group having a carbon number of 1 to 8, an alkoxycarbonyl group having a carbon number of 1 to 8, a carboxyl group, a halogen atom, a hydroxyl group, a cyano group and an acid-decomposable group. n2 represents an integer of 0 to 4. When n2 is 2 or more, the plurality of Rb2's may be the same or different and may combine with each other to form a ring.

Examples of the repeating unit containing a group having a lactone structure represented by any one of formulae (LC1-1) to (LC1-16) include a repeating unit where at least one of $R_{13}'$ to $R_{16}'$ in formula (II-AB1) or (II-AB2) has a group represented by any one of formulae (LC1-1) to (LC1-16) (for example, $R_5$ of —COOR$_5$ is a group represented by any one of formulae (LC1-1) to (LC1-16)), and a repeating unit represented by the following formula (AI):

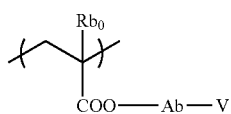

(AI)

In formula (AI), $Rb_0$ represents a hydrogen atom, a halogen atom or an alkyl group having a carbon number of 1 to 4. Preferred examples of the substituent which the alkyl group or $Rb_0$ may have include a hydroxyl group and a halogen atom. Examples of the halogen atom of $Rb_0$ include a fluorine atom, a chlorine atom, a bromine atom and an iodine atom. $Rb_0$ is preferably a hydrogen atom or a methyl group.

Ab represents an alkylene group, a divalent linking group having a monocyclic or polycyclic alicyclic hydrocarbon structure, a single bond, an ether group, an ester group, a carbonyl group, a carboxyl group, or a divalent group comprising a combination thereof, preferably a single bond or a linking group represented by -Ab1-CO$_2$—.

Ab1 is a linear or branched alkylene group or a monocyclic or polycyclic cycloalkylene group, preferably a methylene group, an ethylene group, a cyclohexyl group, an adamantyl group or a norbornyl group.

V represents a group represented by any one of formulae (LC1-1) to (LC1-16).

The repeating unit having a lactone structure usually has an optical isomer, but any optical isomer may be used. One optical isomer may be used alone or a mixture of a plurality of optical isomers may be used. In the case of mainly using one optical isomer, the optical purity (ee) thereof is preferably 90 or more, more preferably 95 or more. Specific examples of the repeating unit containing a group having a lactone structure are set forth below, but the present invention is not limited thereto.

(In formulae, Rx is H, CH$_3$, CH$_2$OH or CF$_3$.)

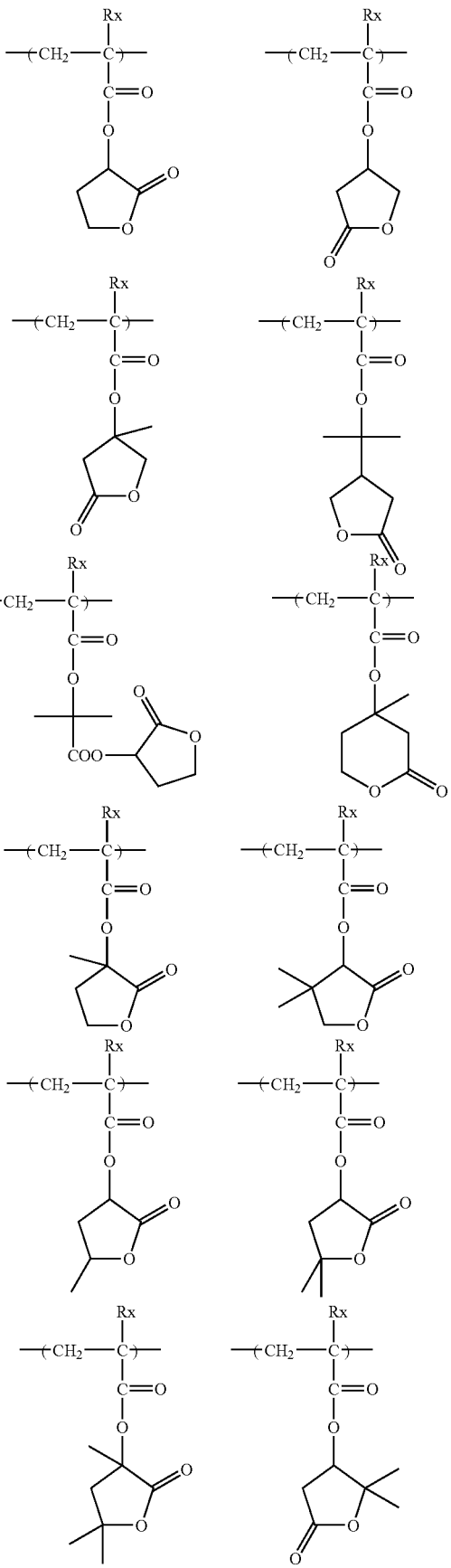

-continued
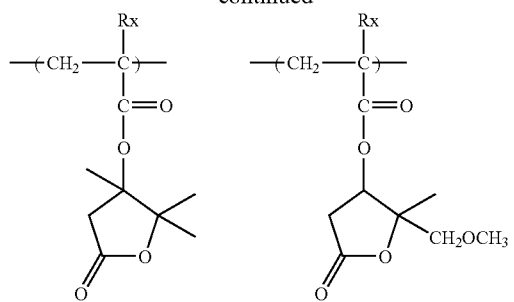
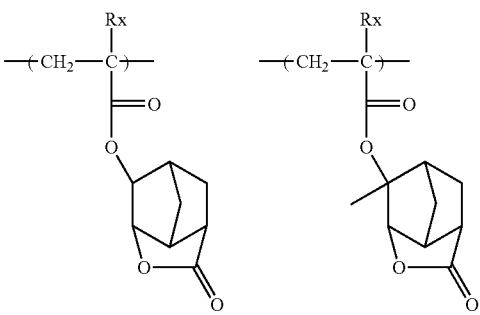
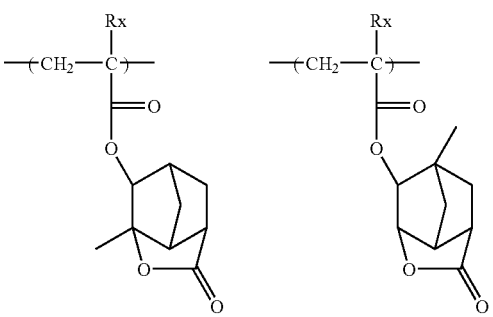
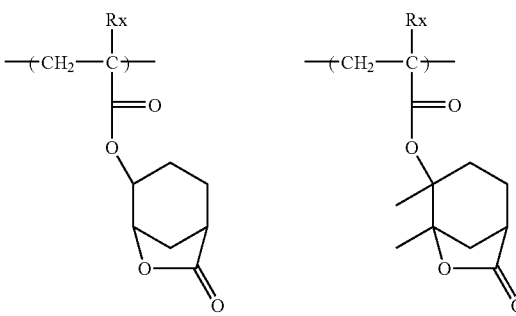
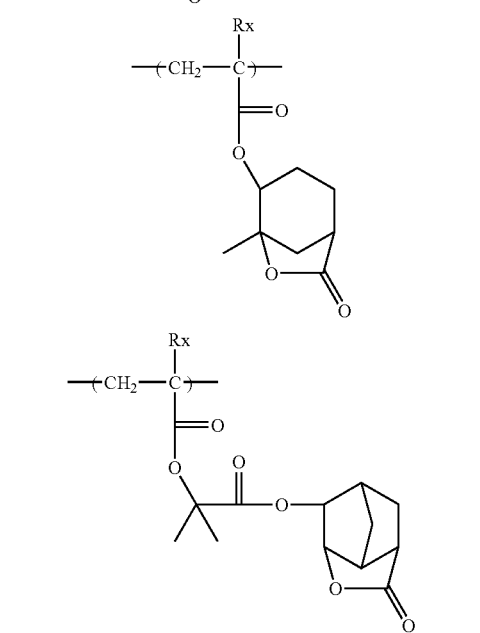
(In formulae, Rx is H, CH₃, CH₂OH or CF₃.)

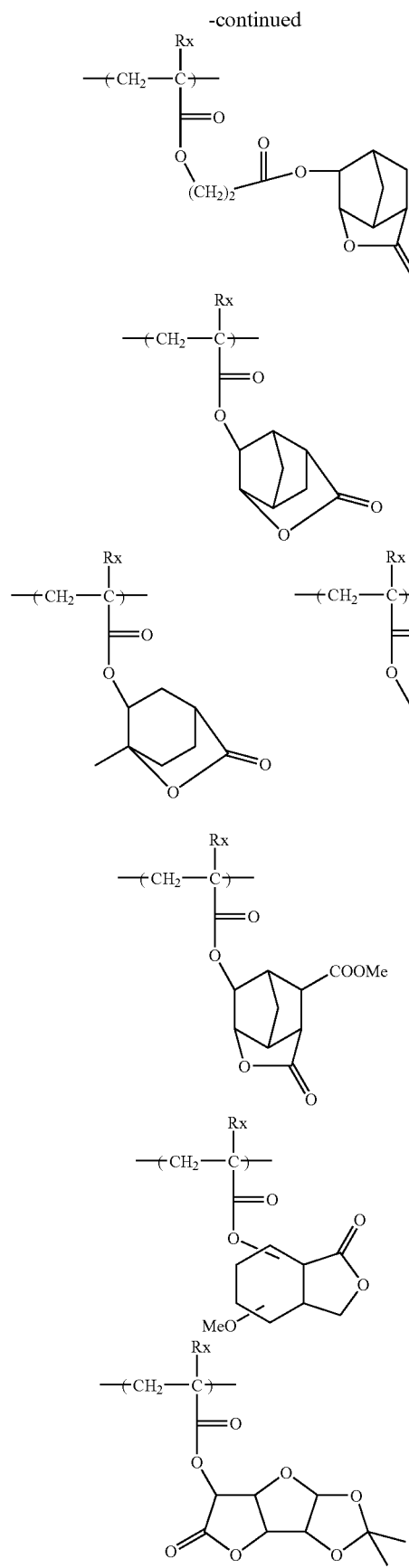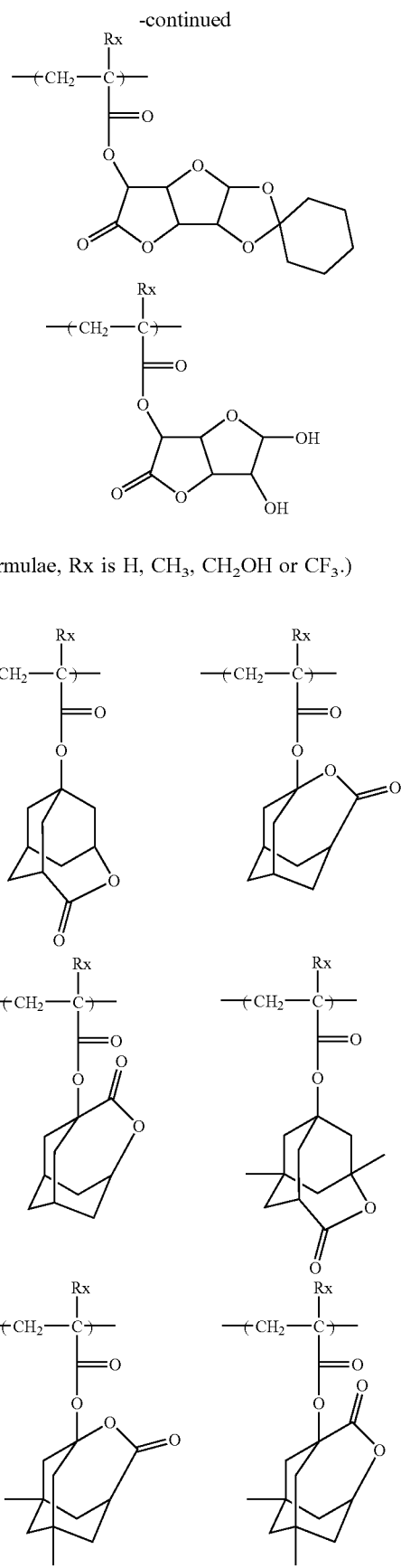
(In formulae, Rx is H, CH₃, CH₂OH or CF₃.)

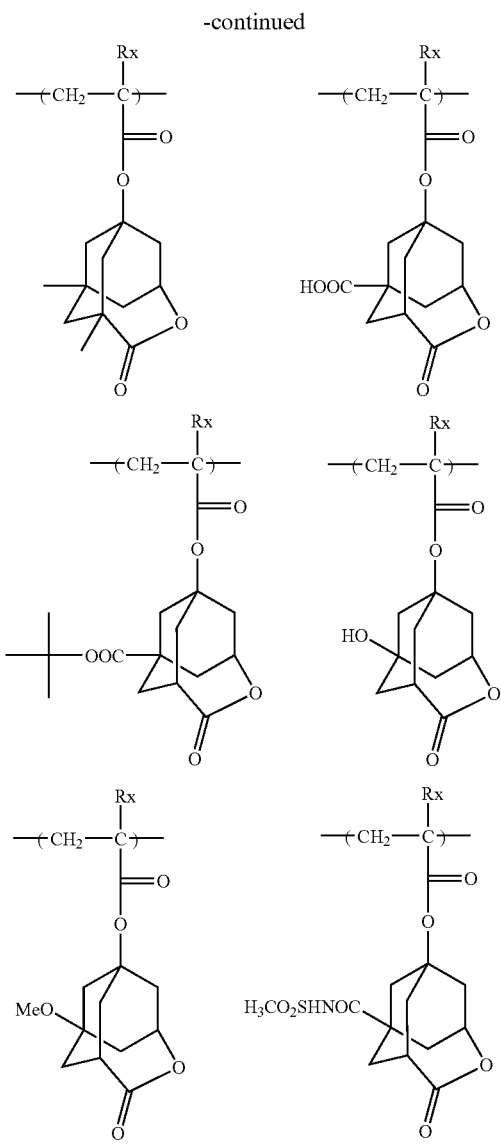

The acid-decomposable resin for use in the present invention preferably contains a repeating unit having an alicyclic hydrocarbon structure substituted by a polar group. By virtue of this repeating unit, the adhesion to substrate and the affinity for developer are enhanced. The polar group is preferably a hydroxyl group or a cyano group.

Examples of the group having an alicyclic hydrocarbon structure substituted by a polar group include the groups represented by the following formulae (VIIa) and (VIIb):

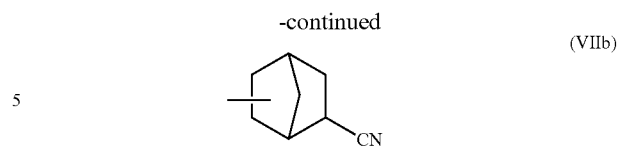

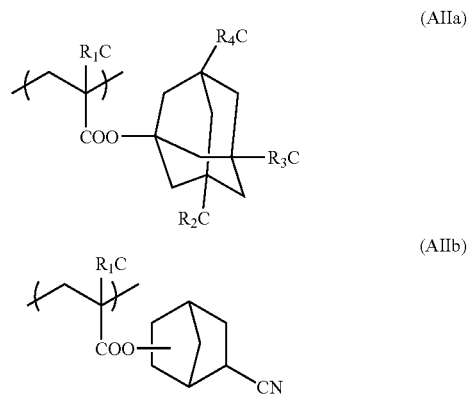

In formula (VIIa), $R_{2c}$ to $R_{4c}$ each independently represents a hydrogen atom, a hydroxyl group or a cyano group, provided that at least one of $R_{2c}$ to $R_{4c}$ represents a hydroxyl group or a cyano group. Preferably, one or two members out of $R_{2c}$ to $R_{4c}$ is a hydroxyl group with the remaining being a hydrogen atom, and more preferably, two members out of $R_{2c}$ to $R_{4c}$ are a hydroxyl group with the remaining being a hydrogen atom.

The group represented by formula (VIIa) is preferably a dihydroxy form or a monohydroxy form, more preferably a dihydroxy form.

Examples of the repeating unit having a group represented by formula (VIIa) or (VIIb) include a repeating unit where at least one of $R_{13}'$ to $R_{16}'$ in formula (II-AB1) or (II-AB2) has a group represented by formula (VIIa) or (VIIb) (for example, where $R_5$ in —$COOR_5$ is a group represented by formula (VIIa) or (VIIb)), and a repeating unit represented by the following formula (AIIa) or (AIIb):

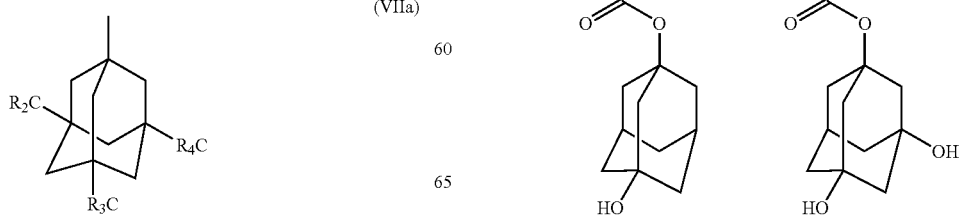

In formulae (AIIa) and (AIIb), $R_{1c}$ represents a hydrogen atom, a methyl group, a trifluoromethyl group or a hydroxymethyl group.

$R_{2c}$ to $R_{4c}$ have the same meanings as $R_{2c}$ to $R_{4c}$ in formula (VIIa).

Specific examples of the repeating units represented by formulae (AIIa) and (AIIb) are set forth below, but the present invention is not limited thereto.

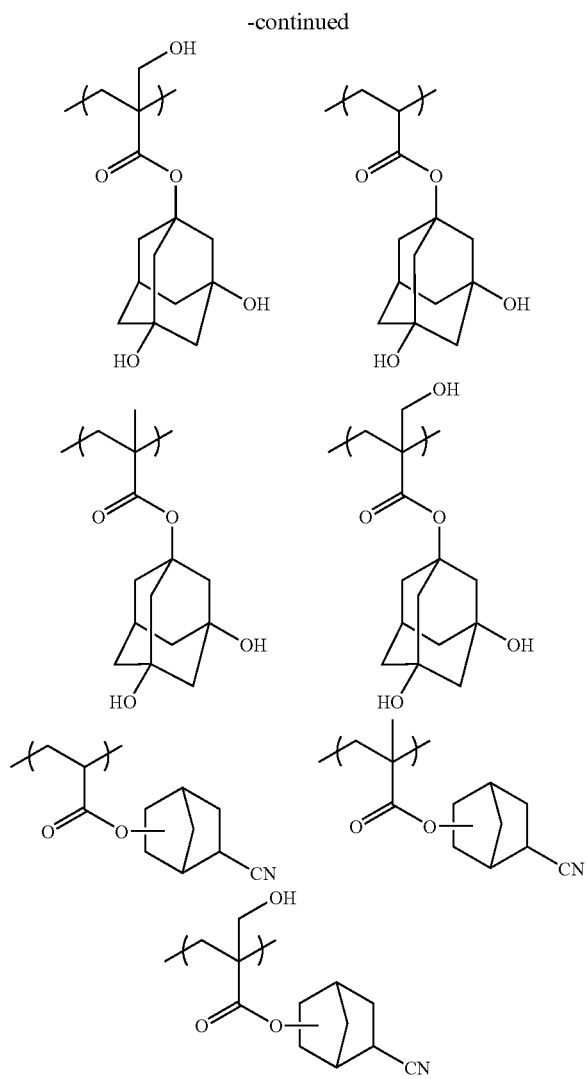

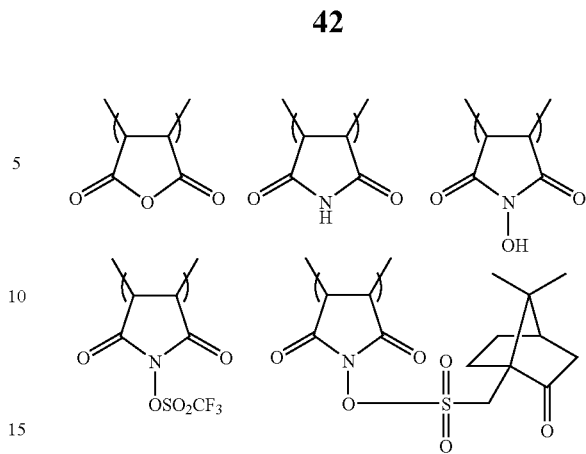

The acid-decomposable resin for use in the present invention preferably contains a repeating unit having an alkali-soluble group, more preferably a repeating unit having a carboxyl group. By virtue of containing such a repeating unit, the resolution increases in usage of forming contact holes. The repeating unit having a carboxyl group is preferably a repeating unit where a carboxyl group is directly bonded to the resin main chain, such as repeating unit by an acrylic acid or a methacrylic acid, or a repeating unit where a carboxyl group is bonded to the resin main chain through a linking group. The linking group may have a monocyclic or polycyclic hydrocarbon structure. An acrylic acid and a methacrylic acid are particularly preferred.

The acid-decomposable resin for use in the present invention may contain a repeating unit having from 1 to 3 groups represented by the following formula (F1). By virtue of containing this repeating unit, the line edge roughness performance is enhanced.

The acid-decomposable resin for use in the present invention may contain a repeating unit represented by the following formula (VIII):

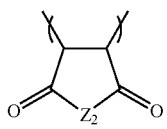

(VIII)

In formula (VIII), $Z_2$ represents —O— or —N($R_{41}$)—.

$R_{41}$ represents a hydrogen atom, a hydroxyl group, an alkyl group or —OSO$_2$—$R_{42}$.

$R_{42}$ represents an alkyl group, a cycloalkyl group or a camphor residue.

The alkyl group of $R_{41}$ and $R_{42}$ may be substituted by a halogen atom (preferably a fluorine atom) or the like.

Specific examples of the repeating unit represented by formula (VIII) are set forth below, but the present invention is not limited thereto.

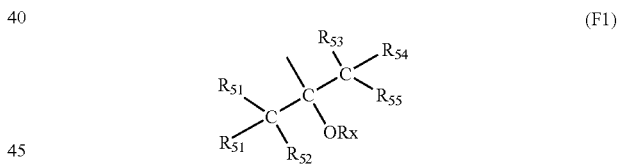
(F1)

In formula (F1), $R_{50}$ to $R_{55}$ each independently represents a hydrogen atom, a fluorine atom or an alkyl group, provided that at least one of $R_{50}$ to $R_{55}$ is a fluorine atom or an alkyl group with at least one hydrogen atom being substituted by a fluorine atom.

Rx represents a hydrogen atom or an organic group.

The alkyl group of $R_{50}$ to $R_{55}$ may be substituted by a halogen atom (e.g., fluorine), a cyano group or the like, and is preferably an alkyl group having a carbon number of 1 to 3, such as methyl group and trifluoromethyl group. It is preferred that $R_{50}$ to $R_{55}$ all are a fluorine atom.

The organic group represented by Rx is preferably an acid-decomposable group or an alkyl, cycloalkyl, acyl, alkylcarbonyl, alkoxycarbonyl, alkoxycarbonylmethyl, alkoxymethyl or 1-alkoxyethyl group which may have a substituent. The repeating unit having a group represented by formula (F1) is preferably a repeating unit represented by the following formula (F2):

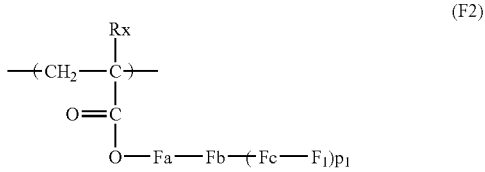

In formula (F2), Rx represents a hydrogen atom, a halogen atom or an alkyl group having a carbon number of 1 to 4. Preferred examples of the substituent which the alkyl group of Rx may have include a hydroxyl group and a halogen atom.

Fa represents a single bond or a linear or branched alkylene group (preferably a single bond).

Fb represents a monocyclic or polycyclic hydrocarbon group. The cyclic hydrocarbon group in Fb is preferably a cyclopentyl group, a cyclohexyl group or a norbornyl group.

Fc represents a single bond or a linear or branched alkylene group (preferably a single bond or a methylene group).

$F_1$ represents a group represented by formula (F1).

$p_1$ represents a number of 1 to 3.

Specific examples of the repeating unit having a structure of formula (F1) are set forth below, but the present invention is not limited thereto.

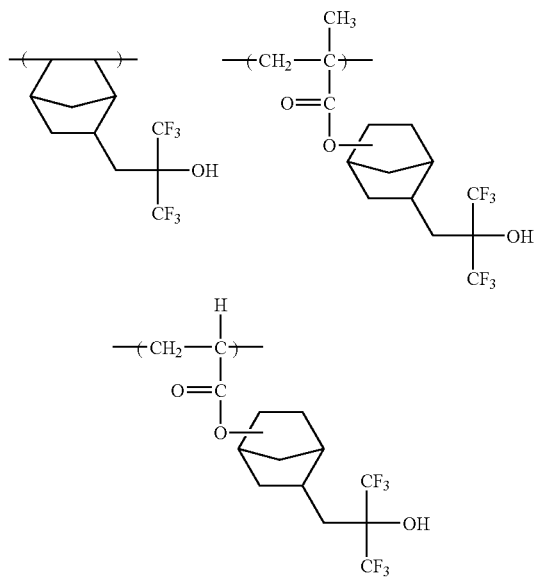

The acid-decomposable resin for use in the present invention may contain, in addition to the above-described repeating units, various repeating structural units for the purpose of controlling the dry etching resistance, suitability for standard developer, adhesion to substrate, resist profile and properties generally required of the resist, such as resolving power, heat resistance and sensitivity.

Examples of such a repeating structural unit include, but are not limited to, repeating structural units corresponding to the monomers described below.

By virtue of containing such a repeating structural unit, the performance required of the alicyclic hydrocarbon-based acid-decomposable resin, particularly, (1) solubility in the coating solvent, (2) film-forming property (glass transition point), (3) alkali developability, (4) film loss (selection of hydrophilic, hydrophobic or alkali-soluble group), (5) adhesion of unexposed part to substrate, (6) dry etching resistance and the like, can be subtly controlled.

Examples of the monomer include a compound having one addition-polymerizable unsaturated bond, selected from acrylic acid esters, methacrylic acid esters, acrylamides, methacrylamides, allyl compounds, vinyl ethers and vinyl esters.

A monomer other than these compounds may also be copolymerized as long as it is an addition-polymerizable unsaturated compound copolymerizable with the monomer corresponding to the above-described various repeating structural units.

In the acid-decomposable resin, the molar ratio of respective repeating structural units contained is appropriately selected to adjust the dry etching resistance of resist, suitability for standard developer, adhesion to substrate, resist profile and performances generally required of the resist, such as resolving power, heat resistance and sensitivity.

The preferred embodiment of the acid-decomposable resin includes the followings:

(1) a resin containing a repeating unit having an alicyclic hydrocarbon-containing partial structure represented by any one of formulae (pI) to (pVI) (side chain type), preferably containing a repeating unit by a (meth)acrylate having a structure represented by any one of formulae (pI) to (pVI), and (2) a resin containing a repeating unit represented by formula (II-AB) (main chain type).

The resin of (2) further includes:

(3) a resin containing a repeating unit represented by formula (II-AB), a maleic anhydride derivative and a repeating unit by a (meth)acrylate structure (hybrid type).

In the acid-decomposable resin, the content of the repeating unit having an acid-decomposable group is preferably from 10 to 60 mol %, more preferably from 20 to 50 mol %, still more preferably from 25 to 40 mol %, based on all repeating structural units.

In the acid-decomposable resin, the content of the repeating unit having an alicyclic hydrocarbon-containing partial structure represented by any one of formulae (pI) to (pVI) is preferably from 20 to 70 mol %, more preferably from 24 to 65 mol %, still more preferably from 28 to 60 mol %, based on all repeating structural units.

In the acid-decomposable resin, the content of the repeating unit represented by formula (II-AB) is preferably from 10 to 60 mol %, more preferably from 15 to 55 mol %, still more preferably from 20 to 50 mol %, based on all repeating structural units.

The content of the repeating structural unit based on the monomer of the additional copolymerization component in the resin can also be appropriately selected according to the desired resist performance, but the content thereof is preferably 99 mol % or less, more preferably 90 mol % or less, still more preferably 80 mol % or less, based on the total molar number of the repeating structural unit having an alicyclic hydrocarbon-containing partial structure represented by any one of formulae (pI) to (pVI) and the repeating unit represented by formula (II-AB).

Each repeating structural unit set forth above as specific examples may be used singly or as a mixture of a plurality thereof. Also, in the present invention, one resin may be used or a plurality of resins may be used in combination.

When the composition of the present invention is used for exposure with ArF, the resin preferably contains no aromatic group in view of transparency to ArF light.

The acid-decomposable resin for use in the present invention is preferably a resin where all repeating units comprise a (meth)acrylate repeating unit. In this case, the repeating units may be all a methacrylate, all an acrylate or all a mixture of methacrylate/acrylate, but the content of the acrylate repeating unit is preferably 50 mol % or less based on all repeating units. The acid-decomposable resin for use in the present invention is more preferably a ternary copolymerization polymer comprising from 25 to 50% of the repeating unit having an alicyclic hydrocarbon-containing partial structure represented by any one of formulae (pI) to (pVI), from 25 to 50% of the repeating unit having a lactone structure and from 5 to 30% of the repeating unit having an alicyclic hydrocarbon structure substituted by a polar group, or a quaternary copolymerization polymer additionally comprising from 5 to 20% of the repeating unit having a carboxyl group or a structure represented by formula (F1).

The acid-decomposable resin for use in the present invention can be synthesized by an ordinary method (for example, radical polymerization). Examples of the synthesis method in general include a batch polymerization method of dissolving the monomer species and an initiator in a solvent and heating the solution, thereby effecting the polymerization, and a dropping polymerization method of adding dropwise a solution containing the monomer species and an initiator in a heated solvent over 1 to 10 hours. A dropping polymerization method is preferred. Examples of the reaction solvent include tetrahydrofuran, 1,4-dioxane, ethers (e.g., diisopropyl ether), ketones (e.g., methyl ethyl ketone, methyl isobutyl ketone), an ester solvent (e.g., ethyl acetate), an amide solvent (e.g., dimethylformamide, diethylacetamide), and a solvent capable of dissolving the composition of the present invention, which is described later, such as propylene glycol monomethyl ether acetate, propylene glycol monomethyl ether and cyclohexanone. The polymerization is preferably performed by using the same solvent as the solvent used in the positive resist composition of the present invention. By the use of this solvent, generation of particles during storage can be suppressed. The polymerization reaction is preferably performed in an inert gas atmosphere such as nitrogen or argon. As for the polymerization initiator, the polymerization is started by using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reactant is charged into a solvent, and the desired polymer is recovered by a method such as powder or solid recovery. The reaction concentration is from 5 to 50 mass %, preferably from 10 to 30 mass %, and the reaction temperature is usually from 10 to 150° C., preferably from 30 to 120° C., more preferably from 50 to 100° C. The weight average molecular weight of the acid-decomposable resin is preferably from 2,000 to 200,000, more preferably from 5,000 to 50,000, still more preferably from 7,000 to 30,000, in terms of polystyrene by the GPC method. The molecular weight distribution of the acid-decomposable resin is usually from 1 to 5, preferably from 1 to 4, more preferably from 1 to 3. When the molecular weight distribution is from 1 to 5, the resolution and resist profile can be enhanced and the resist pattern can be prevented from deterioration such as roughened side wall or roughness.

In the positive resist composition of the present invention, the amount of the acid-decomposable resin blended in the entire composition is preferably from 40 to 99.99 mass %, more preferably from 50 to 99 mass %, still more preferably from 80 to 96 mass %, based on the entire solid content.

[3] (C) Chain Compound Having One or Two Group(s) Selected from a Hydroxyl Group and a Group where the Hydrogen Atom of a Hydroxyl Group is Substituted with an Organic Group, and being a Solid at Ordinary Temperature Under Atmospheric Pressure The positive resist composition of the present invention comprises a chain compound having one or two group(s) selected from a hydroxyl group and a group where the hydrogen atom of a hydroxyl group is substituted with an organic group, and being a solid at ordinary temperature under atmospheric pressure (760 mmHg, 25° C.) (hereinafter sometimes referred to as a "compound (C)").

The compound (C) is a solid at ordinary temperature under atmospheric pressure and does not contain a general alcohol-based solvent. The compound (C) is preferably a compound having a melting point of 30° C. or more at 760 mmHg and 25° C. Incidentally, the compound (C) has an optical isomer depending on the structure, but includes all of the optical isomers.

The total number of hydroxyl group and the group where the hydrogen atom of a hydroxyl group is substituted with an organic group, contained in the compound (C), is 1 or 2, preferably 2. When the total number of hydroxyl group and the group where the hydrogen atom of a hydroxyl group is substituted with an organic group, contained in the compound (C), is 1 or 2, good compatibility with the resist composition is obtained and the effect of the present invention is brought out.

The group where the hydrogen atom of a hydroxyl group is substituted with an organic group, contained in the compound (C), is preferably a linear alkoxy group having a carbon number of 1 to 3, more preferably an ethoxy group or a methoxy group, still more preferably a methoxy group.

The number of carbon atoms contained in the compound (C) is usually from 8 to 28, preferably from 9 to 24, more preferably from 10 to 20. When the carbon number of the compound (C) is from 8 to 30, the development defect can be decreased and at the same time, deterioration in the developability of the unexposed part can be prevented.

The compound (C) is preferably represented by the following formula (I):

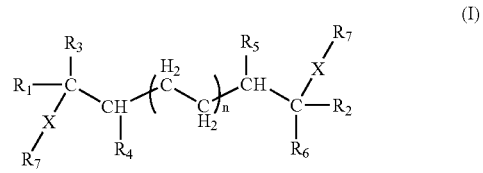

wherein $R_1$ and $R_2$ each independently represents a methyl group, a hydroxyl group or a group where the hydrogen atom of a hydroxyl group is substituted with an organic group, $R_3$ to $R_6$ each independently represents a hydrogen atom, a methyl group, a hydroxyl group or a group wheree the hydrogen atom of a hydroxyl group is substituted with an organic group, provided that the total of the number of hydroxyl group and the number of the group where the hydrogen atom of a hydroxyl group is substituted with an organic group, in $R_1$ to $R_6$ is 1 or 2, X represents a single bond or a double bond, R$_7$ represents a hydrogen atom or an oxygen atom, provided that when X is a single bond, R$_7$ represents a hydrogen atom and when X is a double bond, R$_7$ represents an oxygen atom, and n is an integer of 2 to 10.

Specific examples of the compound (C) are set forth below, but the present invention is not limited thereto.

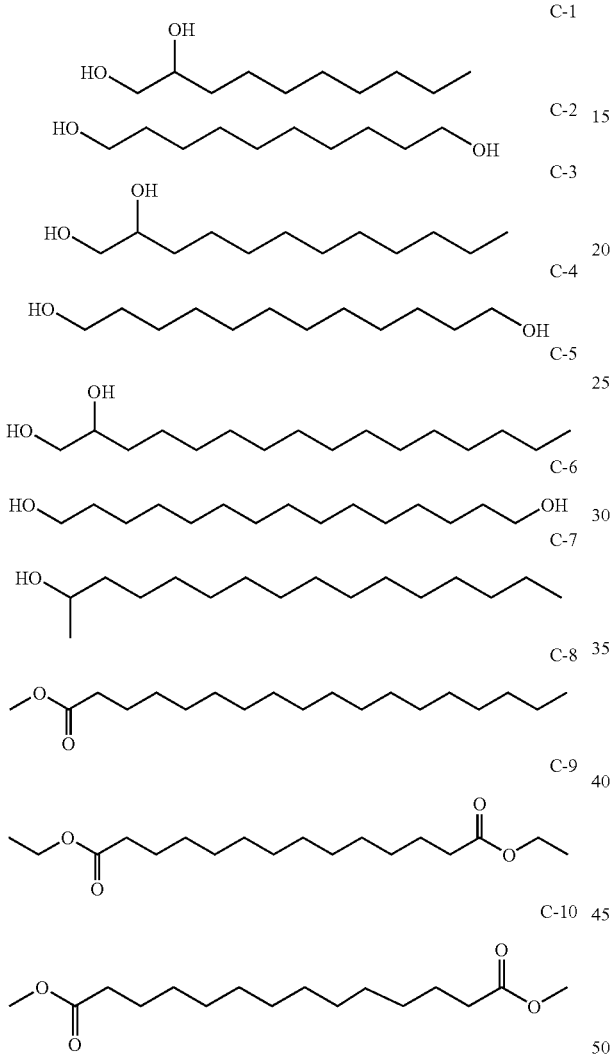

The amount used of the compound (C) is usually from 0.001 to 10 mass %, preferably from 0.01 to 5 mass %, based on the solid content of the positive resist composition. When the amount used of the compound (C) is from 0.001 to 10 mass %, the effect of the present invention can be exerted by preventing reduction of sensitivity or significant film loss.

The compound (C) may be added as a sole compound or as a combination of several compounds.

[4] (D) Basic Compound

The positive resist composition of the present invention preferably contains a basic compound for reducing the change of performance in aging from exposure to heating or for controlling the diffusion of the acid generated from the compound (A) upon exposure. Examples of the basic compound include a nitrogen-containing basic compound.

The nitrogen-containing basic compound may be sufficient if it does not deteriorate sublimation or resist performance and, for example, an organic amine, a basic ammonium salt or a basic sulfonium salt is used. Here, the basic ammonium salt or basic sulfonium salt is a compound having a basic site such as hydroxyl group or amino group in its anion moiety. Among these nitrogen-containing basic compounds, an organic amine is preferred because of excellent image performance. Examples of the basic compound which can be used include those described in JP-A-63-149640, JP-A-5-249662, JP-A-5-127369, JP-A-5-289322, JP-A-5-249683, JP-A-5-289340, JP-A-5-232706, JP-A-5-257282, JP-A-6-242605, JP-A-6-242606, JP-A-6-266110, JP-A-6-266110, JP-A-6-317902, JP-A-7-120929, JP-A-7-146558, JP-A-7-319163, JP-A-7-508840, JP-A-7-333844, JP-A-7-219217, JP-A-7-92678, JP-A-7-28247, JP-A-8-22120, JP-A-8-110638, JP-A-8-123030, JP-A-9-274312, JP-A-9-166871, JP-A-9-292708, JP-A-9-325496, JP-T-7-508840 (the term (the term "JP-T" as used herein means a "published Japanese translation of a PCT patent application"), and U.S. Pat. Nos. 5,525,453, 5,629,134 and 5,667,938.

Specifically, the basic compound includes a compound having a structure represented by any one of the following formulae (A) to (E).

In formula (A), R$^{250}$, R$^{251}$ and R$^{252}$ each independently represents a hydrogen atom, an alkyl group having a carbon number of 1 to 20, a cycloalkyl group having a carbon number of 3 to 20 or an aryl group having a carbon number of 6 to 20, and R$^{250}$ and R$^{251}$ may combine with each other to form a ring. These alkyl group, cycloalkyl group and aryl group each may have a substituent such as hydroxy group and amino group. Also, these groups each may contain an oxygen atom, a sulfur atom or a nitrogen atom in the alkyl chain.

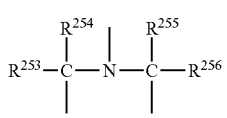

In formulae (B) to (E), R$^{253}$, R$^{254}$, R$^{255}$ and R$^{256}$ each independently represents an alkyl group having a carbon number of 1 to 6.

Preferred examples of the compounds include a substituted or unsubstituted guanidine, a substituted or unsubstituted aminopyrrolidine, a substituted or unsubstituted pyrazole, a substituted or unsubstituted pyrazoline, a substituted or unsubstituted piperazine, a substituted or unsubstituted aminomorpholine, a substituted or unsubstituted aminoalkylmorpholine, and a substituted or unsubstituted piperidine. More preferred examples thereof include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include a triarylsulfonium hydroxide, a phenacylsulfonium hydroxide and a sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiphenium hydroxide. The compound having an onium carboxylate structure is a compound where the anion moiety of the compound having an onium hydroxide structure is a carboxylate, and examples thereof include an acetate, an adamantane-1-carboxylate and a perfluoroalkyl carboxylate. Examples of the compound having a trialkylamine structure include tri(n-butyl)amine and tri(n-octyl)amine. Examples of the aniline compound include 2,6-diisopropylaniline and N,N-dimethylaniline. Examples of the alkylamine derivative having a hydroxyl group and/or an ether bond include ethanolamine, diethanolamine, triethanolamine and tris(methoxyethoxyethyl) amine. Examples of the aniline derivative having a hydroxyl group and/or an ether bond include N,N-bis(hydroxyethyl) aniline.

These basic compounds are used individually or in combination of two or more thereof. The amount of the basic compound used is usually from 0.001 to 10 mass %, preferably from 0.01 to 5 mass %, based on the solid content of the positive resist composition. When the amount of the basic compound used is from 0.001 to 10 mass %, the effect by the addition of the basic compound is obtained and the tendency toward reduction in the sensitivity or worsened developability of the unexposed part can be prevented.

[5] (E) Fluorine- and/or Silicon-Containing Surfactant

The positive resist composition of the present invention preferably further contains (E) any one fluorine- and/or silicon-containing surfactant (a fluorine-containing surfactant, a silicon-containing surfactant or a surfactant containing both a fluorine atom and a silicon atom), or two or more thereof. When the positive resist composition of the present invention contains this surfactant (E), a resist pattern with good sensitivity, high resolution and less failure of adhesion and development can be obtained on use of an exposure light source of 250 nm or less, particularly 220 nm or less.

Examples of the surfactant (E) include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, and U.S. Pat. Nos. 5,405,720, 5,360,692, 5,529,881, 5,296,330, 5,436,098, 5,576,143, 5,294,511 and 5,824,451. The following commercially available surfactants each may also be used as it is. Examples of the commercially available surfactant which can be used include a fluorine-containing surfactant and a silicon-containing surfactant, such as EFtop EF301 and EF303 (produced by Shin-Akita Kasei K.K.), Florad FC430 and 431 (produced by Sumitomo 3M Inc.), Megafac F171, F173, F176, F189 and R08 (produced by Dainippon Ink & Chemicals, Inc.), Surflon S-382, SC101, 102, 103, 104, 105 and 106 (produced by Asahi Glass Co., Ltd.), Troysol S-366 (produced by Troy Chemical), and PF6320 and 6520 (produced by OMNOVA). In addition, a polysiloxane polymer, KP-341 (produced by Shin-Etsu Chemical Co., Ltd.), may also be used as a silicon-containing surfactant.

The amount of the surfactant used is preferably from 0.0001 to 2 mass %, more preferably from 0.001 to 1 mass %, based on the entire amount of the positive resist composition (excluding the solvent).

[6] (F) Organic Solvent

In the positive resist composition of the present invention, respective components are used by dissolving these in a predetermined organic solvent. Examples of the organic solvent which can be used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. These solvents may be used individually or as a mixture.

Among these solvents, preferred are cyclohexanone, 2-heptanone, γ-butyrolactone, ethylene glycol monomethyl ether, ethylene glycol monoethyl ether, ethylene glycol monoethyl ether acetate, propylene glycol monomethyl ether, propylene glycol monoethyl ether, propylene glycol monomethyl ether acetate, methyl lactate, ethyl lactate, methyl methoxypropionate, ethyl ethoxypropionate, N-methylpyrrolidone and tetrahydrofuran. In the present invention, the organic solvents may be used individually or as a mixture, but a mixed solvent containing two kinds of solvents differing in the functional group is preferably used. The mixed solvent containing two kinds of solvents differing in the functional group is preferably a mixed solvent containing a solvent having a hydroxyl group in the structure and a solvent not having a hydroxyl group in the structure, or a mixed solvent containing a solvent having an ester structure and a solvent having a ketone structure. By virtue of using such a mixed solvent, generation of particles during storage of the resist can be reduced.

If desired, the positive resist composition of the present invention may further contain, for example, a dye, a plasticizer, a surfactant other than the component (E), a photosensitizer, an acid-decomposable dissolution inhibiting compound, and a compound capable of accelerating the solubility in a developer.

Specific examples of the surfactant other than the fluorine- and/or silicon-containing surfactant (E) include a nonionic surfactant such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylallyl ethers (e.g., polyoxyethylene octylphenol ether, polyoxyethylene nonylphenol ether), polyoxyethylene.polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate). One of these surfactants may be added alone, or several surfactants may be added in combination.

The positive resist composition of the present invention is used by dissolving the above-described components in a predetermined organic solvent, preferably a mixed solvent described above, and coating the obtained solution on a predetermined support as follows. That is, the positive resist composition is coated on a substrate (e.g., silicon/silicon dioxide-coated substrate) as used in the production of a precision integrated circuit device by an appropriate coating method such as spinner or coater, and dried. After the coating, the film formed is irradiated through a predetermined mask, then baked and developed, whereby a good resist pattern can be obtained. The exposure light used here is preferably a far ultraviolet ray at a wavelength of 250 nm or less, more preferably 220 nm or less. Specific examples of the light source therefor include a KrF excimer laser (248 nm), an ArF excimer laser (193 nm), an F2 excimer laser (157 nm), an X-ray and an electron beam.

In the development step, a development is used as follows. The developer which can be used for the positive resist composition is an alkaline aqueous solution of inorganic alkalis (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcohol amines (e.g., dimethylethanolamine, triethanolamine), a quaternary ammonium salt (e.g., tetramethylammonium hydroxide, tetraethylammonium hydroxide), cyclic amines (e.g., pyrrole, piperidine) or the like. Furthermore, in the alkaline aqueous solution, alcohols and a surfactant may also be added in an appropriate amount.

EXAMPLES

The present invention is described in greater detail below by referring to Examples, but the present invention is not limited to these Examples.

Synthesis Example 1

(Synthesis of Resin (1)):

2-Methyl-2-adamantyl methacrylate and butyrolactone methacrylate were charged at a ratio of 55/45 (by mol) and dissolved in methyl ethyl ketone/tetrahydrofuran (=5/5 by mass) to prepare 100 ml of a solution having a solid content concentration of 20 mass %. Subsequently, 2 mol % of a polymerization initiator, V-65, produced by Wako Pure Chemical Industries, Ltd. was added thereto, and the resulting solution was added dropwise to 10 ml of methyl ethyl ketone heated at 60° C., over 4 hours in a nitrogen atmosphere. After the completion of dropwise addition, the reaction solution was heated for 4 hours and 1 mol % of V-65 was again added thereto, followed by stirring for 4 hours. After the completion of reaction, the reaction solution was cooled to room temperature and crystallized in 3 liter of a mixed solvent of distilled water/ISO propyl alcohol (=1/1 by mass) to synthesize Resin (1) having a structure shown below as a white powder precipitated.

The compositional ratio in the polymer as determined from $^{13}CNMR$ was 46/54. Also, the standard polystyrene-reduced weight average molecular weight as determined by the GPC measurement was 10,700.

Resins (2) to (42) were synthesized by the same operation as in Synthesis Example (1).

Resin (1):

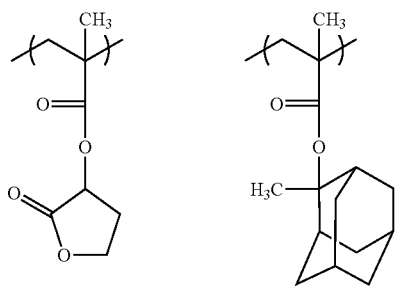

Structures of Resins (2) to (42) are shown below.

(2)

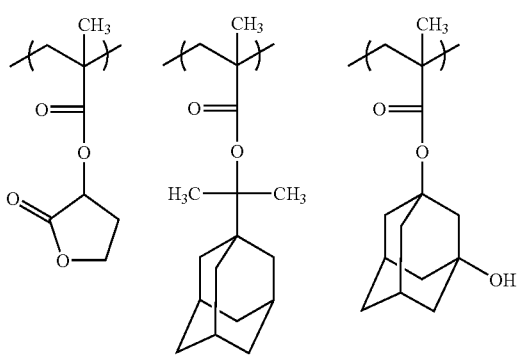

(3)

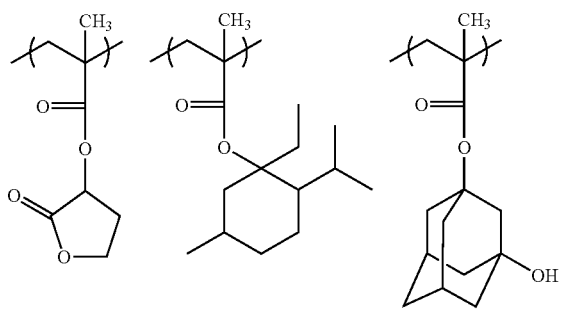

(4)

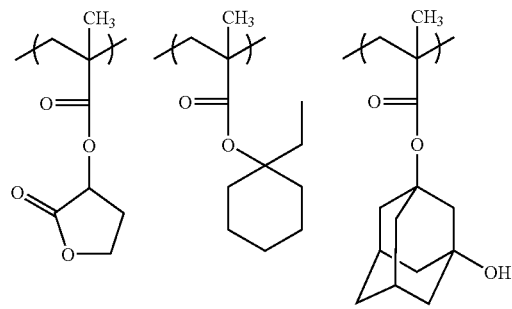

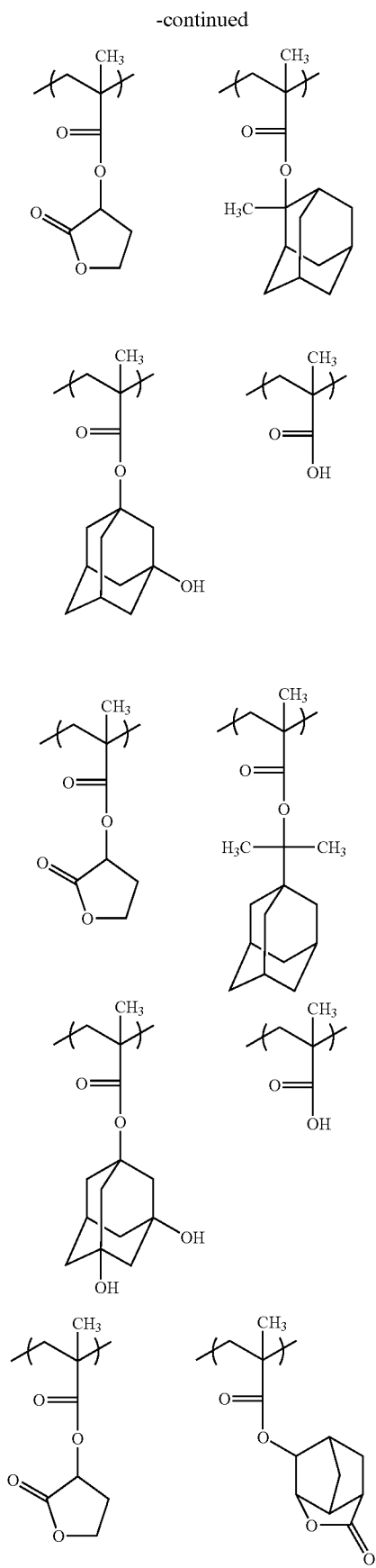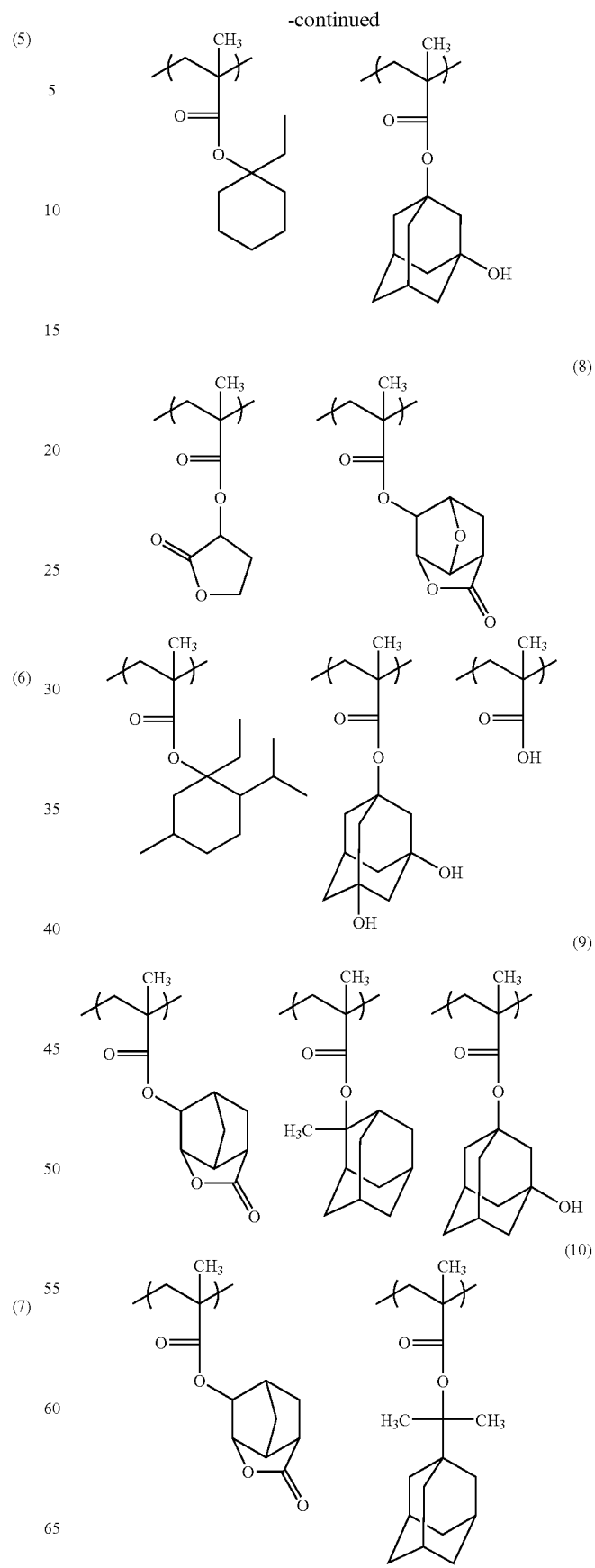

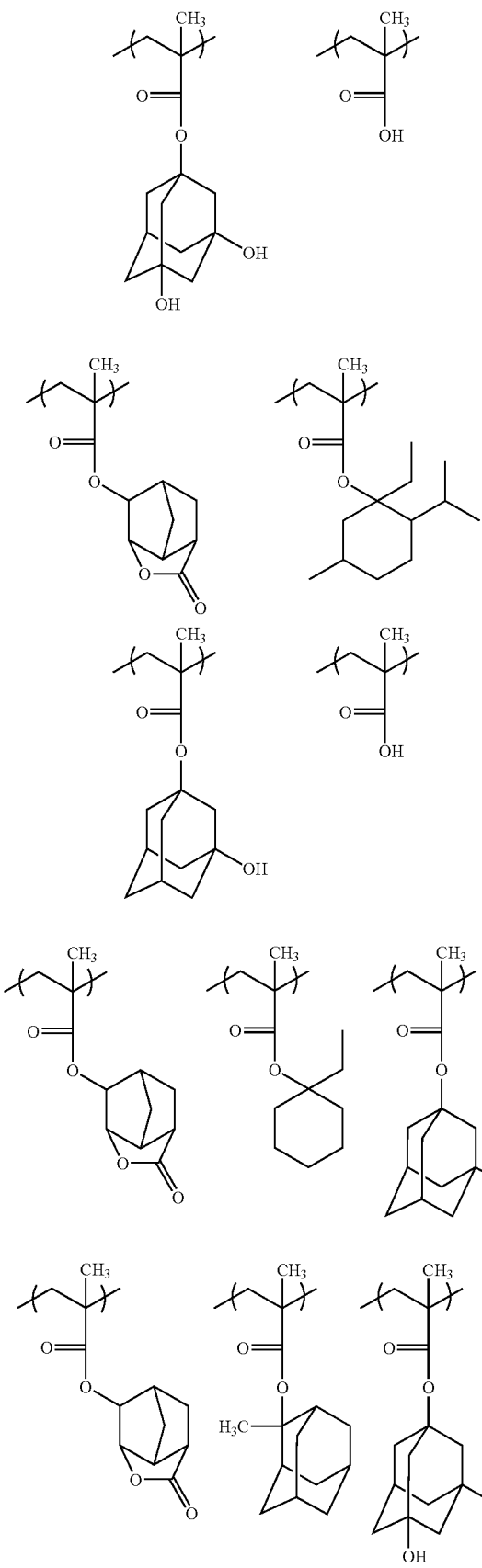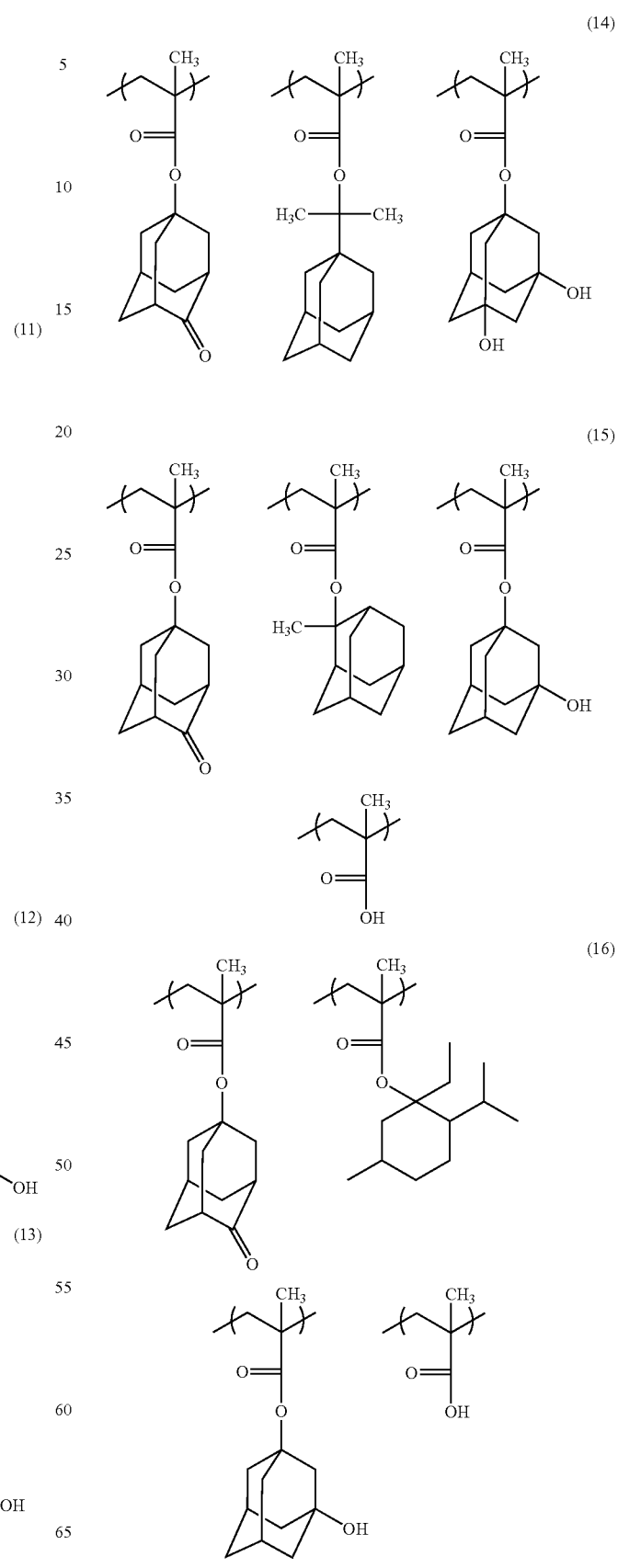

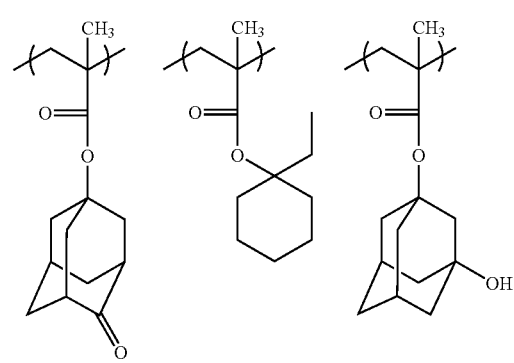
(17)
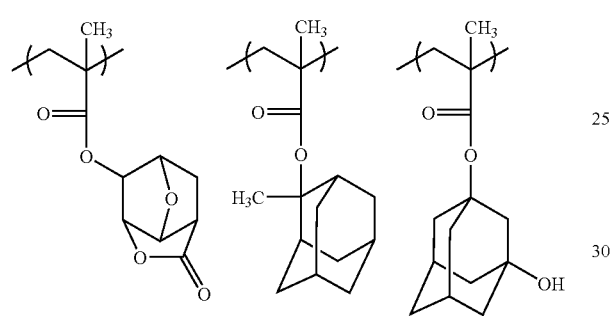
(18)
(19)
(20)
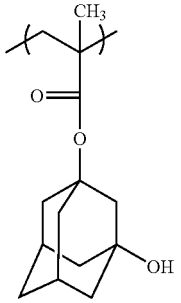
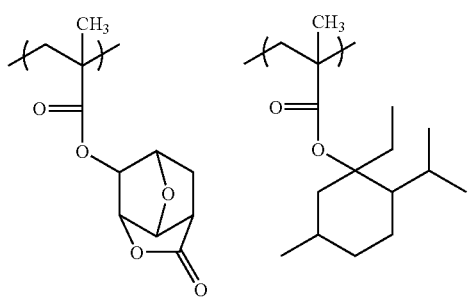
(21)
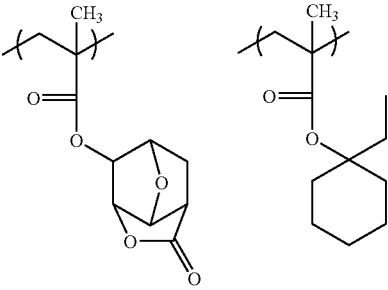
(22)
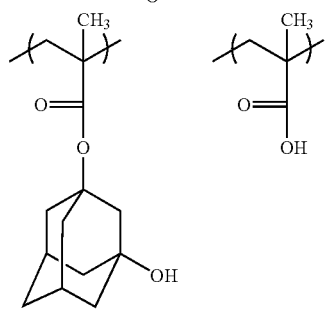

(23)
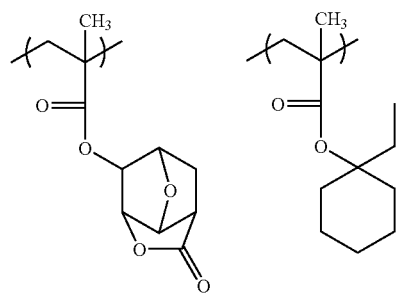
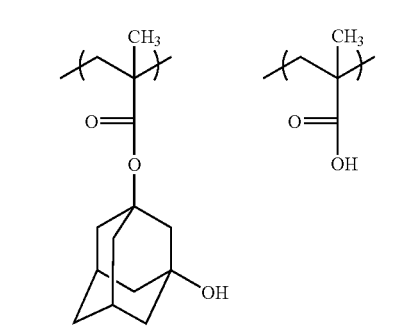
(24)
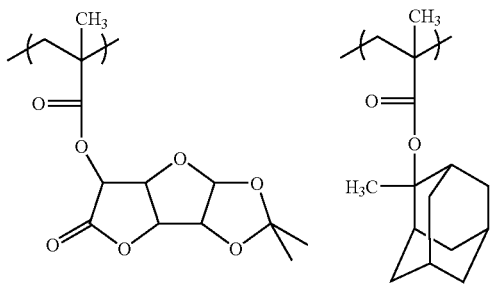
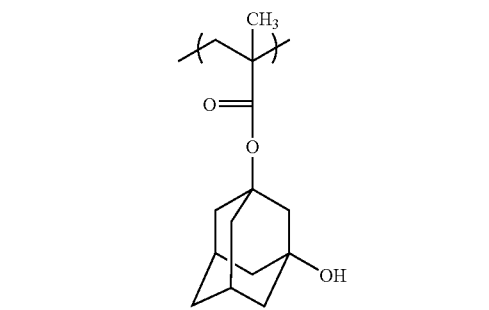
(25)
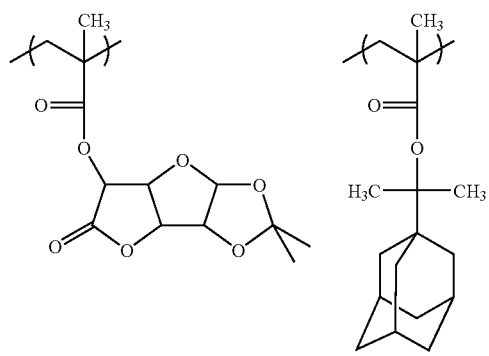
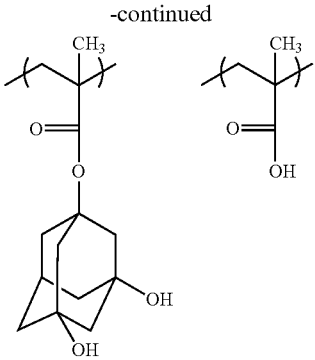
(26)
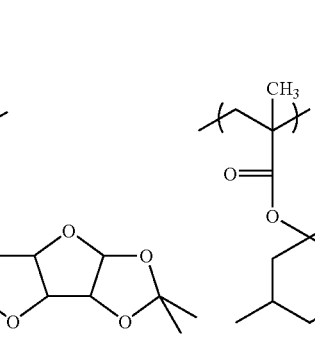
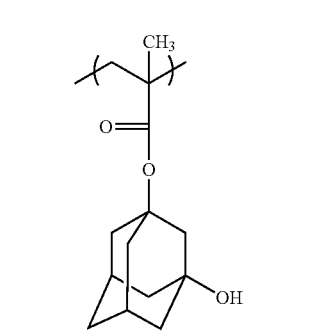
(27)
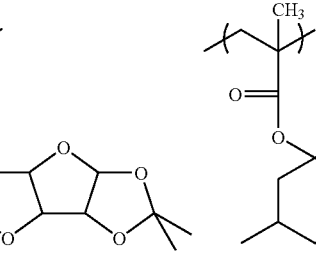
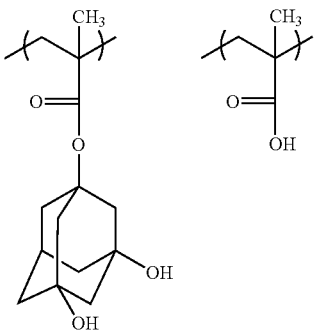

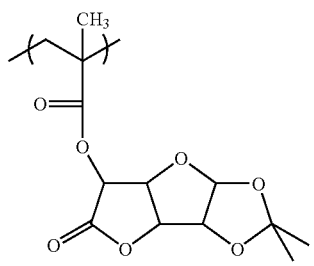
(28)
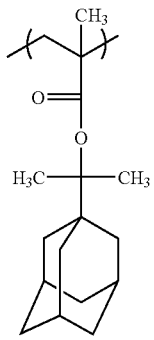
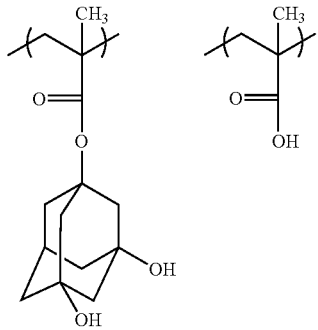
(29)
(31)
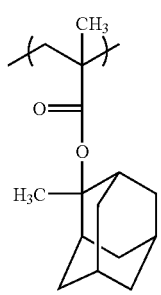
(30)
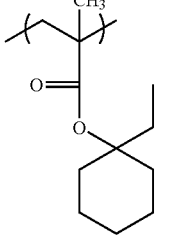
(32)
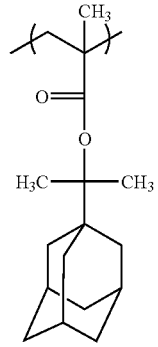
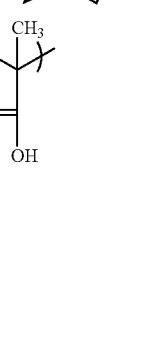

(33)
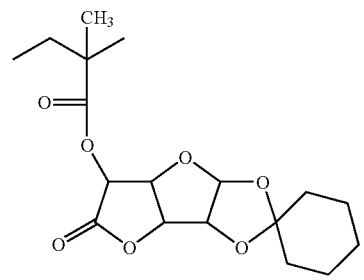
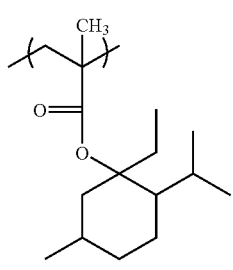 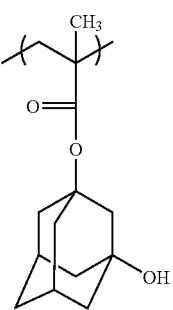
(34)
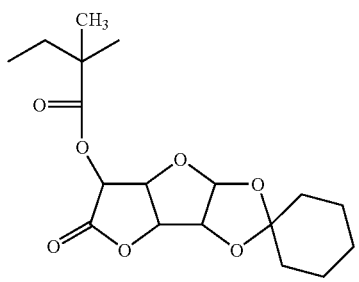
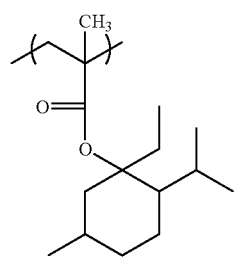 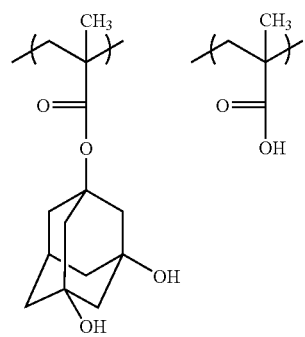
(35)
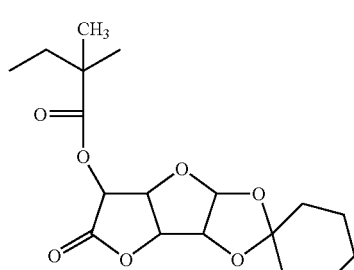 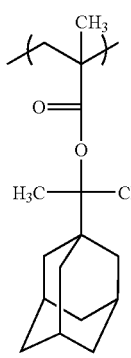
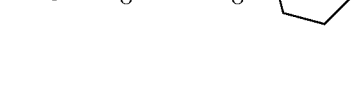
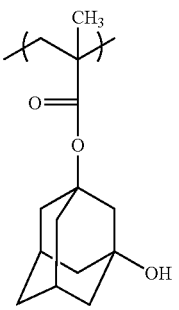
(36)
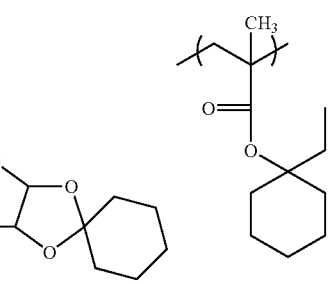
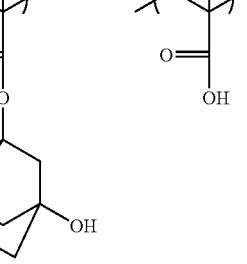
(37)
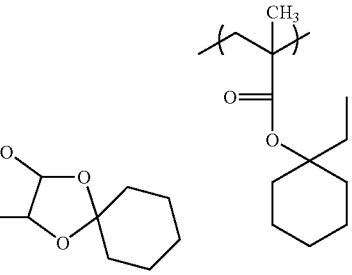
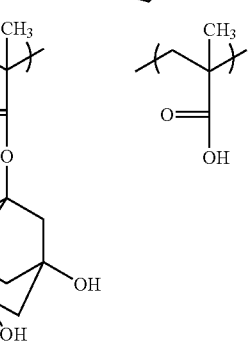

-continued

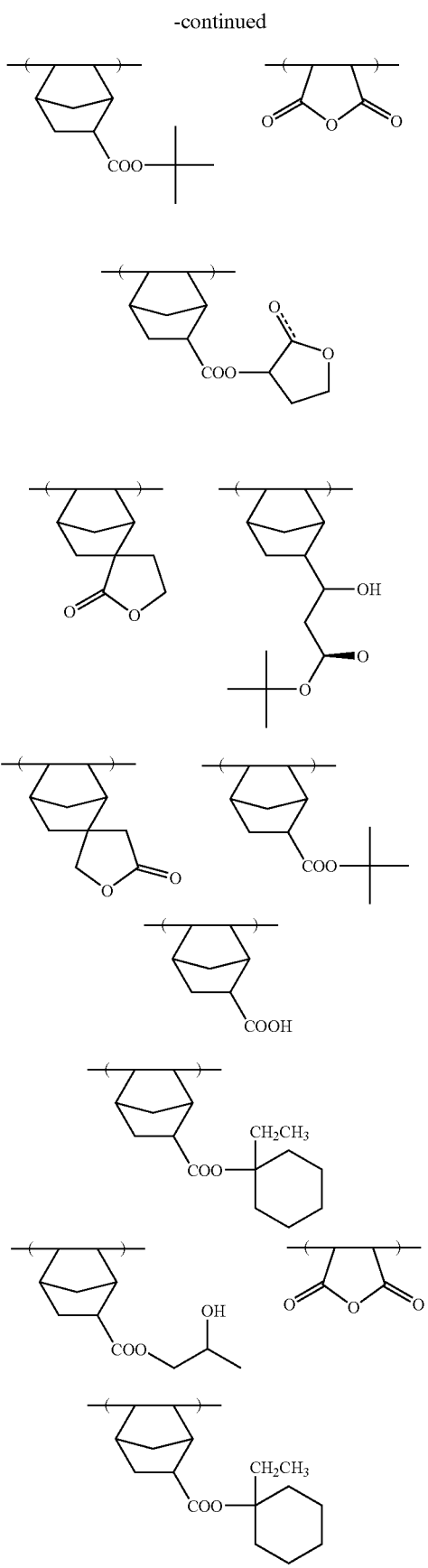

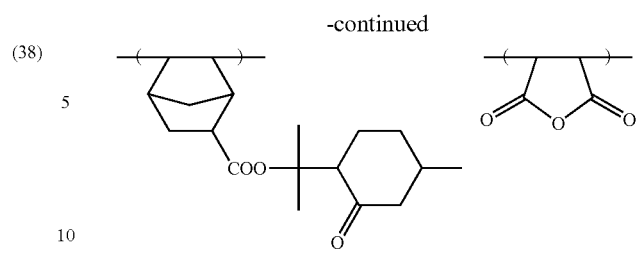

The compositional ratio and molecular weight of each of Resins (2) to (42) are shown below (the repeating units 1, 2, 3 and 4 are in the order from the left of tthe structure formula).

TABLE 1

| Resin | Repeating Unit 1 (mol %) | Repeating Unit 2 (mol %) | Repeating Unit 3 (mol %) | Repeating Unit 4 (mol %) | Repeating Unit 5 (mol %) | Molecular Weight |
|---|---|---|---|---|---|---|
| 2 | 41 | 40 | 19 | — | — | 11000 |
| 3 | 35 | 45 | 20 | — | — | 10000 |
| 4 | 38 | 39 | 23 | — | — | 10500 |
| 5 | 35 | 35 | 18 | 12 | — | 11500 |
| 6 | 38 | 30 | 21 | 11 | — | 12500 |
| 7 | 21 | 25 | 35 | 19 | — | 12000 |
| 8 | 18 | 22 | 35 | 15 | 10 | 12500 |
| 9 | 35 | 48 | 17 | — | — | 11500 |
| 10 | 32 | 35 | 22 | 11 | — | 10000 |
| 11 | 33 | 39 | 22 | 6 | — | 9500 |
| 12 | 35 | 43 | 22 | — | — | 12000 |
| 13 | 38 | 42 | 20 | — | — | 11500 |
| 14 | 33 | 45 | 22 | — | — | 11000 |
| 15 | 31 | 41 | 19 | 9 | — | 12500 |
| 16 | 36 | 36 | 18 | 10 | — | 9500 |
| 17 | 34 | 48 | 18 | — | — | 11000 |
| 18 | 32 | 45 | 23 | — | — | 10500 |
| 19 | 48 | 28 | 18 | 6 | — | 9500 |
| 20 | 42 | 42 | 16 | — | — | 9500 |
| 21 | 28 | 38 | 24 | 10 | — | 10000 |
| 22 | 38 | 31 | 19 | 12 | — | 10500 |
| 23 | 25 | 38 | 29 | 8 | — | 13000 |
| 24 | 40 | 40 | 20 | — | — | 11000 |
| 25 | 39 | 28 | 18 | 15 | — | 11000 |
| 26 | 45 | 42 | 13 | — | — | 10500 |
| 27 | 42 | 29 | 16 | 13 | — | 10000 |
| 28 | 41 | 41 | 18 | — | — | 9500 |
| 29 | 38 | 30 | 17 | 15 | — | 10500 |
| 30 | 37 | 30 | 21 | 12 | — | 11000 |
| 31 | 38 | 38 | 24 | — | — | 10000 |
| 32 | 41 | 29 | 20 | 10 | — | 10000 |
| 33 | 42 | 45 | 13 | — | — | 10500 |
| 34 | 40 | 27 | 18 | 15 | — | 9500 |
| 35 | 39 | 42 | 19 | — | — | 10500 |
| 36 | 40 | 27 | 21 | 12 | — | 9500 |
| 37 | 41 | 29 | 19 | 11 | — | 10000 |
| 38 | 42 | 50 | 8 | — | — | 8300 |
| 39 | 60 | 40 | — | — | — | 9600 |
| 40 | 20 | 70 | 10 | — | — | 5800 |
| 41 | 30 | 20 | 50 | — | — | 4700 |
| 42 | 38 | 12 | 50 | — | — | 8900 |

Examples 1 to 61 and Comparative Examples 1 to 4

(Preparation and Evaluation of Positive Resist Composition)

A resin (1.03 g), an acid generator (0.00010 mol), a compound (C) (0.00006 mol), a basic compound (0.00004 mol) and a surfactant (100 ppm based on the entirety) were blended as shown in Tables 2 and 3 and dissolved in a solvent shown in Tables 2 and 3 to have a solid content of 8 mass %. The obtained solution was filtered through a polyethylene-made microfilter having a pore size of 0.1 μm. In this way, positive resist compositions of Examples 1 to 61 and Comparative Examples 1 to 4 were prepared. In the case of containing two kinds of acid generators in the resist composition, the positive resist composition was prepared to contain respective acid generators each in an amount of 0.00005 mol. Incidentally, as for the filter for filtering the resist solution, a filter other than that described above may be used. The same results were obtained also when the positive resist compositions of Examples 1 to 61 and Comparative Examples 1 to 4 were prepared by using a polyethylene-made microfilter of 0.03 μm or an ultrahigh molecular weight polyethylene (UPE)-made microfilter of 0.03 μm.

The resist compositions prepared above were evaluated as follows.

[Pattern Falling]

The positive resist composition was coated on a substrate comprising a silicon wafer having applied thereon an antireflective film, ARC-29A (78 nm), produced by Brewer Science Inc., and then baked at 100° C. for 60 seconds to provide a film having a thickness of 0.20 μm. The obtained resist film was exposed through a mask by using an ArF excimer laser scanner (PAS5500/1100, manufactured by ASML, NA=0.75) and immediately after exposure, heated (PEB) on a hot plate at 120° C. for 60 seconds. Thereafter, the resist film was developed with an aqueous 2.38 mass % tetramethylammonium hydroxide solution at 23° C. for 60 seconds, rinsed with pure water for 30 seconds and then dried to obtain a resist line pattern. The pattern formed by changing the exposure amount by 10 mJcm$^{-2}$ to the overexposure side with respect to the exposure amount E1 necessary for reproducing a mask pattern of 0.08 μm (line/space=1/1) was observed by a scanning electron microscope (SEM) and rated □ when no pattern falling occurred, ○ when only slight pattern falling occurred, or × when pattern falling occurred.

[Line Edge Roughness]

A pattern of 0.08 μm (line/space=1/1) was formed in the same manner as in the evaluation of pattern falling and observed by SEM, and the line pattern edge was detected at a plurality of positions within the measuring monitor. The dispersion (3σ) of fluctuations at the detected positions was used as an index for edge roughness. The smaller value is more preferred.

[Development Defect]

A contact hole pattern of 0.08 μm (pitch: 1/3) was formed in the same manner as in the evaluation of pattern falling. The obtained resist pattern was subjected to measurement of the number of development defects by using KLA-2112 Machine manufactured by KLA Tenkol K.K., and the primary data value obtained was used as the number of development defects. Furthermore, based on the data, the defects were observed by SEM and the number of defects (hole clogging defect, killer defect) which become a serious trouble in the formation of contact holes, was counted.

These evaluation results are shown in Tables 2 and 3.

TABLE 2

| | Resin | Photoacid Generator | Component C of the Invention | Basic Compound | Surfactant | Solvent | Development Defect | Pattern Falling | Line Edge Roughness (nm) |
|---|---|---|---|---|---|---|---|---|---|
| Example 1 | 1 | z2 | C-1 | N-5 | W-2 | S-1 | 5 | ⊙ | 4.8 |
| Example 2 | 1 | z2 | C-2 | N-5 | W-2 | S-1 | 7 | ⊙ | 5.0 |
| Example 3 | 1 | z2 | C-3 | N-5 | W-2 | S-1 | 5 | ⊙ | 4.2 |
| Example 4 | 1 | z2 | C-4 | N-5 | W-2 | S-1 | 1 | ⊙ | 3.8 |
| Example 5 | 1 | z2 | C-5 | N-5 | W-2 | S-1 | 2 | ⊙ | 4.4 |
| Example 6 | 1 | z2 | C-6 | N-5 | W-2 | S-1 | 1 | ⊙ | 4.6 |
| Example 7 | 1 | z2 | C-7 | N-5 | W-2 | S-1 | 8 | ⊙ | 7.5 |
| Example 8 | 1 | z2 | C-8 | N-5 | W-2 | S-1 | 6 | ○ | 4.2 |
| Example 9 | 1 | z2 | C-9 | N-5 | W-2 | S-1 | 9 | ○ | 4.3 |
| Example 10 | 1 | z2 | C-10 | N-5 | W-2 | S-1 | 7 | ○ | 5.1 |
| Example 11 | 1 | z2 | C-4 | N-5 | W-2 | S-2 | 2 | ⊙ | 6.5 |
| Example 12 | 1 | z2 | C-4 | N-5 | W-2 | S-4 | 3 | ⊙ | 4.9 |
| Example 13 | 2 | z2 | C-4 | N-5 | W-2 | S-1/S-2 = 5/5 | 2 | ⊙ | 5.6 |
| Example 14 | 2 | z2 | C-4 | N-5 | W-2 | S-1/S-3 = 6/4 | 3 | ⊙ | 6.2 |
| Example 15 | 2 | z2 | C-4 | N-5 | W-2 | S-1/S-4 = 7/3 | 3 | ⊙ | 4.2 |
| Example 16 | 3 | z40 | C-4 | N-6 | W-1 | S-1/S-4 = 7/3 | 1 | ⊙ | 4.7 |
| Example 17 | 4 | z38 | C-4 | N-1 | W-4 | S-1/S-4 = 6/4 | 1 | ⊙ | 4.6 |
| Example 18 | 5 | z68 | C-4 | N-3 | W-5 | S-1/S-4 = 7/3 | 1 | ⊙ | 5.7 |
| Example 19 | 6 | z67 | C-4 | N-4 | W-3 | S-1/S-4 = 7/3 | 2 | ⊙ | 6.5 |
| Example 20 | 7 | z69/z64 | C-4 | N-4 | W-3 | S-1/S-4 = 6/4 | 3 | ⊙ | 5.7 |
| Example 21 | 8 | z56 | C-4 | N-6 | W-2 | S-1/S-4 = 7/3 | 2 | ⊙ | 6.8 |
| Example 22 | 9 | z69 | C-4 | N-7 | W-6 | S-1/S-4 = 6/4 | 1 | ⊙ | 5.8 |
| Example 23 | 10 | z14 | C-4 | N-7 | W-1 | S-1/S-4 = 6/4 | 0 | ⊙ | 4.2 |
| Example 24 | 11 | z16 | C-4 | N-2 | W-4 | S-1/S-4 = 7/3 | 4 | ⊙ | 4.2 |
| Example 25 | 12 | z67 | C-4 | N-1 | W-4 | S-1/S-4 = 6/4 | 2 | ⊙ | 7.0 |
| Example 26 | 13 | z69 | C-4 | N-3 | W-3 | S-1/S-4 = 7/3 | 2 | ⊙ | 5.5 |
| Example 27 | 14 | z71/z61 | C-4 | N-1 | W-4 | S-1/S-4 = 7/3 | 2 | ⊙ | 4.9 |
| Example 28 | 15 | z14 | C-4 | N-5 | W-5 | S-1/S-4 = 6/4 | 1 | ⊙ | 4.2 |
| Example 29 | 16 | z39 | C-4 | N-3 | W-2 | S-1/S-4 = 6/4 | 4 | ⊙ | 5.0 |
| Example 30 | 17 | z38 | C-4 | N-4 | W-1 | S-1/S-4 = 7/3 | 3 | ⊙ | 5.7 |
| Example 31 | 18 | z16 | C-4 | N-6 | W-2 | S-1/S-4 = 6/4 | 2 | ⊙ | 5.2 |
| Example 32 | 19 | z38 | C-4 | N-5 | W-5 | S-1/S-3 = 6/4 | 2 | ⊙ | 5.6 |
| Example 33 | 20 | z69 | C-4 | N-3 | W-4 | S-1/S-4 = 6/4 | 1 | ⊙ | 6.0 |

TABLE 2-continued

|  | Resin | Photoacid Generator | Component C of the Invention | Basic Compound | Surfactant | Solvent | Development Defect | Pattern Falling | Line Edge Roughness (nm) |
|---|---|---|---|---|---|---|---|---|---|
| Example 34 | 21 | z40 | C-4 | N-2 | W-2 | S-1/S-3 = 6/4 | 3 | ◎ | 5.9 |
| Example 35 | 22 | z57 | C-4 | N-1 | W-2 | S-1/S-4 = 6/4 | 2 | ◎ | 5.7 |

TABLE 3

|  | Resin | Photoacid Generator | Component C of the Invention | Basic Compound | Surfactant | Solvent | Development Defect | Pattern Falling | Line Edge Roughness (nm) |
|---|---|---|---|---|---|---|---|---|---|
| Example 36 | 23 | z16 | C-4 | N-4 | W-3 | S-1/S-4 = 7/3 | 3 | ◎ | 5.2 |
| Example 37 | 24 | z60/z67 | C-4 | N-6 | W-2 | S-1/S-4 = 6/4 | 1 | ◎ | 5.4 |
| Example 38 | 25 | z69/z56 | C-4 | N-5 | W-5 | S-1/S-3 = 6/4 | 0 | ◎ | 4.7 |
| Example 39 | 26 | z40 | C-4 | N-3 | W-4 | S-1/S-4 = 6/4 | 1 | ◎ | 4.7 |
| Example 40 | 27 | z38/z62 | C-4 | N-2 | W-2 | S-1/S-3 = 6/4 | 2 | ◎ | 4.6 |
| Example 41 | 28 | z38 | C-4 | N-1 | W-2 | S-1 | 2 | ◎ | 5.5 |
| Example 42 | 29 | z69 | C-4 | N-4 | W-3 | S-1/S-4 = 6/4 | 1 | ◎ | 5.3 |
| Example 43 | 30 | z16 | C-4 | N-7 | W-1 | S-1/S-4 = 7/3 | 0 | ◎ | 5.0 |
| Example 44 | 31 | z3 | C-4 | N-6 | W-2 | S-1/S-4 = 6/4 | 2 | ◎ | 4.7 |
| Example 45 | 32 | z65 | C-4 | N-5 | W-5 | S-1/S-3 = 6/4 | 2 | ◎ | 5.8 |
| Example 46 | 33 | z40 | C-4 | N-3 | W-4 | S-1/S-4 = 6/4 | 0 | ◎ | 4.5 |
| Example 47 | 34 | z3 | C-4 | N-2 | W-2 | S-1/S-3 = 6/4 | 1 | ◎ | 4.6 |
| Example 48 | 35 | z64/z67 | C-4 | N-1 | W-2 | S-1 | 0 | ◎ | 6.2 |
| Example 49 | 36 | z60 | C-4 | N-4 | W-3 | S-1/S-4 = 6/4 | 1 | ◎ | 5.6 |
| Example 50 | 37 | z16 | C-4 | N-7 | W-1 | S-1/S-4 = 7/3 | 3 | ◎ | 5.9 |
| Example 51 | 38 | z38 | C-4 | N-4 | W-3 | S-1/S-3 = 6/4 | 4 | ◎ | 4.9 |
| Example 52 | 39 | z65 | C-4 | N-1 | W-3 | S-1/S-4 = 6/4 | 3 | ◎ | 5.9 |
| Example 53 | 40 | z40 | C-4 | N-7 | W-1 | S-1/S-4 = 7/3 | 3 | ◎ | 5.8 |
| Example 54 | 41 | z57/z69 | C-4 | N-6 | W-2 | S-1/S-4 = 6/4 | 3 | ◎ | 5.0 |
| Example 55 | 42 | z38 | C-4 | N-4 | W-4 | S-1/S-3 = 6/4 | 3 | ◎ | 6.5 |
| Example 56 | 2 | z38 | C-4 | N-4 | W-3 | S-1/S-3 = 6/4 | 2 | ◎ | 5.9 |
| Example 57 | 10 | z65 | C-4 | N-1 | W-3 | S-1/S-4 = 6/4 | 3 | ◎ | 5.6 |
| Example 58 | 11 | z40 | C-4 | N-7 | W-1 | S-1/S-4 = 7/3 | 2 | ◎ | 5.5 |
| Example 59 | 23 | z57/z69 | C-4 | N-6 | W-2 | S-1/S-4 = 6/4 | 3 | ◎ | 4.8 |
| Example 60 | 25 | z38 | C-4 | N-4 | W-4 | S-1/S-3 = 6/4 | 0 | ◎ | 4.5 |
| Example 61 | 39 | z70/z72 | C-4 | N-3 | W-4 | S-1/S-4 = 6/4 | 0 | ◎ | 4.5 |
| Comparative Example 1 | 1 | z2 | C'-1 | N-5 | W-2 | S-1 | 2 | X | 5.5 |
| Comparative Example 2 | 18 | z2 | C'-2 | N-5 | W-2 | S-1 | 15 | X | 14.1 |
| Comparative Example 3 | 18 | z2 | C'-3 | N-5 | W-2 | S-1 | 9 | X | 12.8 |
| Comparative Example 4 | 10 | z2 | C'-4 | N-5 | W-2 | S-1 | 55 | X | 15.3 |

In Tables 2 and 3, the C component of the invention indicates the followings:
C-1: 1,2-decanediol (323-23861, produced by Wako Pure Chemical Industries, Ltd.)
C-2: 1,10-decanediol (047-00092, produced by Wako Pure Chemical Industries, Ltd.)
C-3: 1,2-dodecanediol (327-23881, produced by Wako Pure Chemical Industries, Ltd.)
C-4: 1,12-dodecanediol (323-20402, produced by Wako Pure Chemical Industries, Ltd.)
C-5: 1,2-dihydroxyhexadecane (327-23901, produced by Wako Pure Chemical Industries, Ltd.)
C-6: 1,14-tetradecanediol (325-23941, produced by Wako Pure Chemical Industries, Ltd.)
C-7: 2-hexadecanol (H682-7, produced by Aldrich)
C-8: methyl stearate (S0312, produced by Tokyo Kasei Kogyo Co., Ltd.)
C-9: diethyl tetradecanedioate (14404-5, produced by Aldrich)
C-10: dimethyl tetradecanedioate (T1726, produced by Tokyo Kasei Kogyo Co., Ltd.)

The additive C' in Comparative Examples indicates the followings:
C'-1: 1,2,6-hexanetriol
C'-2: cyclohexanol
C'-3: 1,3-propanediol
C'-4: n-dodecane The basic compound indicates the followings:
N-1: 1,5-diazabicyclo[4.3.0]-5-nonene
N-2: 1,8-diazabicyclo[5.4.0]-7-undecene
N-3: 4-dimethylaminopyridine
N-4: N,N-di(2-hydroxyethyl)aniline
N-5: 2,2'-(p-tolylimino)diethanol
N-6: diisopropylaniline
N-7: tributylamine
N-8: trioctylamine The surfactant indicates the followings:
W-1: Megafac F176 (produced by Dainippon Ink & Chemicals, Inc.) (fluorine-containing)
W-2: Megafac R08 (produced by Dainippon Ink & Chemicals, Inc.) (fluorine- and silicon-containing)
W-3: polysiloxane polymer KP-341 (produced by Shin-Etsu Chemical Co., Ltd.)

W-4: Troysol S-366 (produced by Troy Chemical)
W-5: PF6320 (produced by OMNOVA)
W-6: PF6520 (produced by OMNOVA)

The solvent indicates the followings:
S-1: propylene glycol monomethyl ether acetate
S-2: ethyl lactate
S-3: cyclohexanone
S-4: propylene glycol monomethyl ether In the case of using two kinds of solvents, the ratio is the mass ratio.

The melting points at 25° C. and 760 mmHg of the compounds as the component (C) used in Examples and the additives (C') used in Comparative Examples are shown in Table 4 below.

TABLE 4

| Compound as Component (C) | Melting Point (° C.) | Additive (C') | Melting Point (° C.) |
|---|---|---|---|
| C-1 | 49 | C'-1 | 27 |
| C-2 | 74 | C'-2 | 23 |
| C-3 | 60 | C'-3 | −59 |
| C-4 | 82 | C'-4 | −10 |
| C-5 | 73 | | |
| C-6 | 48 | | |
| C-7 | 45 | | |
| C-8 | 38 | | |
| C-9 | 31 | | |
| C-10 | 43 | | |

As seen in Tables 2 and 3, the positive resist compositions of the present invention all are remarkably reduced in the number of developments defects and assured of satisfactory results in both the light edge roughness and the pattern falling. On the other hand, in the case of using a compound where the number of hydroxyl groups is 3 or more (Comparative Example 1), the result of the pattern falling is inferior due to film loss in the pattern top. Also, even when the number of hydroxyl groups is 1 or 2, in the case of using an alicyclic compound or a compound having a carbon number of 8 or less (Comparative Examples 2 and 3), the results of line edge roughness and pattern falling are inferior to those in Examples of the present invention. In the case of using a compound not having a hydroxyl group (Comparative Example 4), the results of line edge roughness, pattern falling and development defect all are poor as compared with Examples of the present invention.

Similar results were obtained also when other BARC substrates such as AR46 (29 nm) manufactured by Rohm and Haas were used.

This application is based on Japanese patent application JP 2005-047392, filed on Feb. 23, 2005, the entire content of which is hereby incorporated by reference, the same as if set forth at length.

What is claimed is:

1. A positive resist composition comprising:
    (A) a compound capable of generating an acid upon irradiation with actinic rays or radiation;
    (B) a resin having an alicyclic hydrocarbon structure, which decomposes under the action of an acid to increase the solubility in an alkali; and
    (C) a chain compound having one or two group(s) selected from a hydroxyl group and a group where the hydrogen atom of a hydroxyl group is substituted with a linear alkoxy group having a carbon number of 1 to 3, the chain compound being a solid at ordinary temperature under atmospheric pressure, and the chain compound having a carbon number of 9 to 24.

2. The positive resist composition as claimed in claim 1, wherein the compound (C) is represented by the following formula (I):

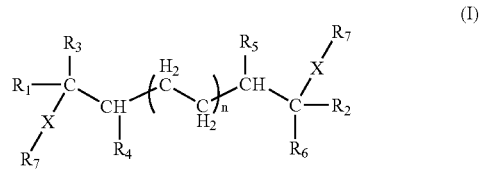

wherein
    $R_1$ and $R_2$ each independently represents a methyl group, a hydroxyl group, or a group where the hydrogen atom of a hydroxyl group is substituted with an organic group,
    $R_3$ to $R_6$ each independently represents a hydrogen atom, a methyl group, a hydroxyl group, or a group where the hydrogen atom of a hydroxyl group is substituted with an organic group,
    provided that the total of the number of hydroxyl group and the number of the group where the hydrogen atom of a hydroxyl group is substituted with an organic group in $R_1$ to $R_6$ is 1 or 2,
    X represents a single bond,
    $R_7$ represents a hydrogen atom, and
    n is an integer of 2 to 10.

3. The positive resist composition as claimed in claim 1, wherein the compound (C) has a melting point of 30° C. or more at 760 mmHg and 25° C.

4. The positive resist composition as claimed in claim 1, which further comprises (D) a basic compound.

5. The positive resist composition as claimed in claim 1, which further comprises (E) a fluorine- and/or silicon-containing surfactant.

6. The positive resist composition as claimed in claim 1, which further comprises (F) an organic solvent.

7. A pattern forming method comprising: forming a resist film from the positive resist composition claimed in claim 1; and exposing and developing said resist film.

* * * * *